(12) United States Patent
Hussell

(10) Patent No.: US 8,575,639 B2
(45) Date of Patent: Nov. 5, 2013

(54) LIGHT EMITTING DEVICES FOR LIGHT EMITTING DIODES (LEDS)

(75) Inventor: Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/435,912

(22) Filed: Mar. 30, 2012

(65) Prior Publication Data

US 2012/0299022 A1   Nov. 29, 2012

Related U.S. Application Data

(63) Continuation-in-part of application No. 13/028,972, filed on Feb. 16, 2011, and a continuation-in-part of application No. 13/104,558, filed on May 10, 2011.

(51) Int. Cl.
*H01L 33/00* (2010.01)

(52) U.S. Cl.
USPC ............ 257/98; 257/89; 257/99; 257/100; 257/E21.592

(58) Field of Classification Search
USPC ............ 257/12–13, 98–99, 103, 431–433, 257/E21.592, E31.117; 438/22, 27–28, 438/48–52
See application file for complete search history.

(56) References Cited

U.S. PATENT DOCUMENTS

| | | | |
|---|---|---|---|
| 4,946,547 A | 8/1990 | Palmour | |
| 5,200,022 A | 4/1993 | Kong | |
| RE34,861 E | 2/1995 | Davis et al. | |
| 6,548,832 B1 | 4/2003 | Sakamoto et al. | |
| 7,224,000 B2 | 5/2007 | Aanegola et al. | |
| D570,797 S | 6/2008 | Song | |
| 7,391,046 B2 * | 6/2008 | Tsutsumi et al. | 257/13 |
| D573,553 S | 7/2008 | Uemoto et al. | |
| D576,576 S | 9/2008 | Shida et al. | |
| 7,482,636 B2 | 1/2009 | Murayama et al. | |
| D589,470 S | 3/2009 | Chen | |
| D591,248 S | 4/2009 | Imai et al. | |
| D593,043 S | 5/2009 | Song | |
| D602,451 S | 10/2009 | Gielen | |
| D603,813 S | 11/2009 | Nishimura et al. | |
| D607,420 S | 1/2010 | Imai et al. | |

(Continued)

FOREIGN PATENT DOCUMENTS

CN   ZL 2011-30139847.5   8/2012
CN   ZL 2011-30166527.9   8/2012

(Continued)

OTHER PUBLICATIONS

Taiwanese Search Report for Application No. 101302309 dated Jan. 14, 2013.

(Continued)

*Primary Examiner* — Dung A. Le
(74) *Attorney, Agent, or Firm* — Jenkins, Wilson, Taylor & Hunt, P.A.

(57) ABSTRACT

Light emitting devices for light emitting diodes (LEDs) are disclosed. In one embodiment a light emitting device can include a submount and a light emission area disposed over the submount. The light emission area can include one or more light emitting diodes (LEDs), a fillet at least partially disposed about the one or more the LEDs, and filling material. The filling material can be disposed over a portion of the one or more LEDs and a portion of the fillet.

52 Claims, 19 Drawing Sheets

(56) References Cited

U.S. PATENT DOCUMENTS

| | | | |
|---|---|---|---|
| 7,649,209 | B2 | 1/2010 | Hussell et al. |
| D615,052 | S | 5/2010 | Imai et al. |
| D618,635 | S | 6/2010 | Imai et al. |
| 7,825,578 | B2 | 11/2010 | Takashima et al. |
| 7,872,418 | B2 | 1/2011 | Hata et al. |
| D637,564 | S | 5/2011 | Tseng et al. |
| 7,994,518 | B2 | 8/2011 | Wang et al. |
| D645,417 | S | 9/2011 | Imai et al. |
| 8,044,418 | B2 | 10/2011 | Loh et al. |
| 8,058,088 | B2 | 11/2011 | Cannon |
| D650,760 | S | 12/2011 | Hussell et al. |
| D667,803 | S | 9/2012 | Hussell et al. |
| D676,000 | S | 2/2013 | Hussell et al. |
| D676,395 | S | 2/2013 | Hussell et al. |
| 2006/0147746 | A1* | 7/2006 | Wakako et al. ............... 428/627 |
| 2006/0186418 | A1 | 8/2006 | Edmond |
| 2007/0018295 | A1 | 1/2007 | Kim et al. |
| 2007/0029569 | A1 | 2/2007 | Andrews |
| 2007/0158668 | A1 | 7/2007 | Tarsa |
| 2008/0054279 | A1 | 3/2008 | Hussell et al. |
| 2008/0054284 | A1 | 3/2008 | Hussell et al. |
| 2008/0054286 | A1 | 3/2008 | Loh et al. |
| 2008/0089072 | A1 | 4/2008 | Kim et al. |
| 2008/0173884 | A1 | 7/2008 | Chitnis |
| 2008/0179611 | A1 | 7/2008 | Chitnis |
| 2008/0224166 | A1 | 9/2008 | Glovatsky et al. |
| 2008/0258130 | A1 | 10/2008 | Bergmann |
| 2009/0261374 | A1 | 10/2009 | Hayashi |
| 2009/0289169 | A1 | 11/2009 | Yang et al. |
| 2009/0315061 | A1 | 12/2009 | Andrews |
| 2010/0078664 | A1 | 4/2010 | Helbing |
| 2010/0141182 | A1 | 6/2010 | Shi |
| 2010/0155763 | A1 | 6/2010 | Donofrio |
| 2010/0193822 | A1* | 8/2010 | Inobe et al. ............... 257/98 |
| 2010/0253248 | A1 | 10/2010 | Shi |
| 2010/0270567 | A1 | 10/2010 | Emerson et al. |
| 2010/0320483 | A1 | 12/2010 | Kadotani et al. |
| 2011/0068674 | A1 | 3/2011 | Takenaka et al. |
| 2011/0128730 | A1 | 6/2011 | Chiu |
| 2011/0291151 | A1 | 12/2011 | Matsuda et al. |
| 2012/0126255 | A1 | 5/2012 | Hussell et al. |
| 2012/0126257 | A1 | 5/2012 | Reiherzer et al. |
| 2012/0193651 | A1 | 8/2012 | Edmond |
| 2012/0205689 | A1 | 8/2012 | Welch |
| 2012/0299022 | A1 | 11/2012 | Hussell |
| 2012/0313135 | A1* | 12/2012 | Kashitani et al. ............... 257/99 |

FOREIGN PATENT DOCUMENTS

| | | |
|---|---|---|
| CN | ZL201230099913.5 | 11/2012 |
| CN | ZL20123009998.1 | 12/2012 |
| CN | ZL201230099954.4 | 12/2012 |
| CN | ZL 201230472866.4 | 5/2013 |
| EP | 2327930 | 6/2011 |
| JP | 07-038940 | 9/1995 |
| JP | 10-311937 | 11/1998 |
| JP | 2001-294083 | 10/2001 |
| JP | 2005-266117 | 9/2005 |
| JP | 2006-294898 | 10/2006 |
| JP | 2007-227680 | 9/2007 |
| JP | 2007-266357 | 10/2007 |
| JP | 2007-323857 | 12/2007 |
| JP | 2007-335371 | 12/2007 |
| JP | 2009-044055 | 2/2009 |
| JP | 2009-289918 | 12/2009 |
| JP | 2010-009972 | 1/2010 |
| KR | 10-0793338 | 1/2008 |
| KR | 10-2008-0092239 | 10/2008 |
| KR | 10-2009-0011121 | 3/2009 |
| KR | 10-2011-0004632 | 1/2011 |
| TW | 113260 | 10/2006 |
| TW | 124444 | 8/2008 |
| TW | 128526 | 5/2009 |
| WO | WO 2012/071136 | 5/2012 |
| WO | WO 2012/071138 | 5/2012 |
| WO | WO 2012/071139 | 5/2012 |
| WO | WO 2013/032737 | 3/2013 |
| WO | WO 2013/070696 | 5/2013 |
| WO | WO 2013/096431 | 6/2013 |

OTHER PUBLICATIONS

Taiwanese Office Action for Application No. 101302309 dated Jan. 23, 2013.
Chinese Decision to Grant for Application No. 201230472866.4 dated Jan. 24, 2013.
Notice of Allowance for U.S. Appl. No. 13/336,540 dated Jan. 31, 2013.
Restriction Requirement for U.S. Appl. No. 13/671,089 dated Feb. 7, 2013.
Restriction Requirement for U.S. Appl. No. 29/404,913 dated Feb. 15, 2013.
Japanese Office Action for Application No. 2012-023963 dated Feb. 26, 2013.
Japanese Office Action for Application No. 2012-026117 dated Feb. 26, 2013.
Chinese Office Action for Application No. CN 2012/30130915.6 dated Feb. 27, 2013.
Notice of Allowance for U.S. Appl. No. 13/028,972 dated Feb. 28, 2013.
International Search Report and Written Opinion for Application No. PCT/US2012/051344 dated Feb. 28, 2013.
International Search Report and Written Opinion for Application No. PCT/US2012/063861 dated Mar. 18, 2013.
Non-Final Office Action for U.S. Appl. No. 13/671,089 dated Mar. 29, 2013.
International Search Report and Written Opinion for Application No. PCT/US2012/070589 dated Apr. 22, 2013.
Bridgelux Product Data Sheet—1 page.
Citizen Co. Product Data Sheet—4 pages http://ce.citizen.co.jp/lighting_led/en/products/index.html.
U.S. Appl. No. 29/379,636 for "Light Emitting Device Package" filed Nov. 22, 2010.
Design U.S. Appl. No. 29/380,387 for "Light Emitting Device Package" filed Dec. 3, 2010.
U.S. Appl. No. 13/028,972 for "Light Emitting Devices and Methods" filed Feb. 16, 2011.
U.S. Appl. No. 13/104,558 for "Light Emitting Devices and Methods" filed May 10, 2011.
Notice of Allowance for U.S. Appl. No. 29/379,636 dated Aug. 4, 2011.
Design U.S. Appl. No. 29/404,913 for "Light Emitting Device Component" filed Oct. 26, 2011.
U.S. Appl. No. 13/224,850 for "Light Emitting Device Component" filed Sep. 2, 2011.
Design U.S. Appl. No. 29/379,636 for "Light Emitting Device Package" filed Nov. 22, 2011.
Design U.S. Appl. No. 29/408,955 for "Light Emitting Device Package" filed Dec. 19, 2011.
U.S. Appl. No. 13/336,540 dated Dec. 23, 2011.
Notification of Granting Patent Right for Design for Application Serial No. CN 2011/30166527.9 dated Apr. 6, 2012.
Non-Final Office Action for U.S. Appl. No. 29/380,387 dated Apr. 25, 2012.
Notification of Granting Patent Right for Design for Application Serial No. CN 2011/30139847.5 dated Apr. 26, 2012.
Notice of Allowance for U.S. Appl. No. 29/408,955 dated May 7, 2012.
Notice of Allowance for U.S. Appl. No. 29/407,084 dated May 18, 2012.
International Search Report and Written Opinion for Application Serial No. PCT/US2011/058603 dated May 23, 2012.
International Search Report and Written Opinion for Application Serial No. PCT/US2011/058601 dated May 24, 2012.
International Search Report and Written Opinion for Application Serial No. PCT/US2011/058596 dated Jun. 18, 2012.

(56) References Cited

OTHER PUBLICATIONS

Chinese Office Action for Application Serial No. CN 2012/30130915.6 dated Jul. 12, 2012.
Office Action/Restriction Requirement for U.S. Appl. No. 13/028,972 dated Jul. 25, 2012.
Notification of Grant for Chinese Patent Application No. 2012/30099913.5 dated Aug. 7, 2012.
Notification of Grant for Chinese Patent Application No. 2012/30099981.1 dated Aug. 17, 2012.
Notification of Grant for Chinese Patent Application No. 2012/30099954.4 dated Aug. 17, 2012.
Notice of Allowance for U.S. Appl. No. 29/407,084 dated Aug. 21, 2012.
Notice of Allowance for U.S. Appl. No. 29/380,387 dated Sep. 18, 2012.
Notice of Allowance for U.S. Appl. No. 29/408,955 dated Oct. 4, 2012.
Non-Final Office Action for U.S. Appl. No. 13/028,972 dated Oct. 10, 2012.
Chinese Office Action for Application No. CN 2012/30130915.6 dated Oct. 24, 2012.
Chinese Office Action for Application No. 201230472866.4 dated Nov. 14, 2012.
Non-Final Office Action for U.S. Appl. No. 13/104,558 dated Jan. 3, 2013.
International Search Report and Written Opinion for Application No. PCT/US2013/025307 dated May 15, 2013.
Japanese Office Action for Application No. 2012-031549 dated Jun. 4, 2013.
Japanese Decision of Registration for Application No. 2012-023963 dated Jun. 4, 2013.
Japanese Decision of Registration for Application No. 2012-026117 dated Jun. 4, 2013.
Taiwanese Notice of Allowance for Application No. 101302309 dated Jun. 5, 2013.
Chinese Notice of Grant for Application No. 201230652790.3 dated Jun. 26, 2013.
Chinese Notice of Grant for Application No. 201230130915.6 dated Jul. 3, 2013.
Chinese Decision to Grant for Application No. 201230652789 dated Jul. 17, 2013.

\* cited by examiner

US 8,575,639 B2

LIGHT EMITTING DEVICES FOR LIGHT EMITTING DIODES (LEDS)

CROSS REFERENCE TO RELATED APPLICATIONS

This application relates and is a continuation-in-part of and claims priority to each of U.S. patent application Ser. No. 13/028,972, filed Feb. 16, 2011; and U.S. patent application Ser. No. 13/104,558, filed May 10, 2011. The disclosures of each of the related applications referenced herein are hereby incorporated by reference in their entireties.

TECHNICAL FIELD

The subject matter disclosed herein relates generally to light emitting devices and methods. More particularly, the subject matter disclosed herein relates to light emitting devices and methods having increased brightness via increased reflectivity and more uniform encapsulant.

BACKGROUND

Light emitting diode (LED) chips, or LEDs, may be utilized in packages for providing white light (e.g., perceived as being white or near-white), and are developing as replacements for incandescent, fluorescent, and metal halide high-intensity discharge (HID) light products. A representative example of an LED device comprises a device having at least one LED chip, a portion of which can be coated with a phosphor such as, for example, yttrium aluminum garnet (YAG). The phosphor coating can convert light emitted from one or more LED chips into white light. For example, LED chips can emit light having desired wavelengths, and phosphor can in turn emit yellow fluorescence with a peak wavelength of about 550 nm. A viewer perceives the mixture of light emissions as white light. As an alternative to phosphor converted white light, light emitting devices of red, green, and blue (RGB) wavelengths can be combined in one device or package to produce light that is perceived as white.

Despite availability of various light emitting devices and methods in the marketplace, a need remains for brighter devices. In one aspect, brighter devices can be achieved by reducing the occurrence of defects during encapsulation of the devices. Light emitting devices and methods described herein can advantageously enhance light output performance while promoting ease of manufacture.

SUMMARY

In accordance with this disclosure, novel light emitting devices and methods are provided that are well suited for a variety of applications, including industrial and commercial lighting products. It is, therefore, an object of the present disclosure herein to provide improved and brighter light emitting devices, in part by increasing reflectivity within the device. Another object of the present disclosure is to reduce the occurrence of light affecting defects within the device, and to provide more uniform encapsulant.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
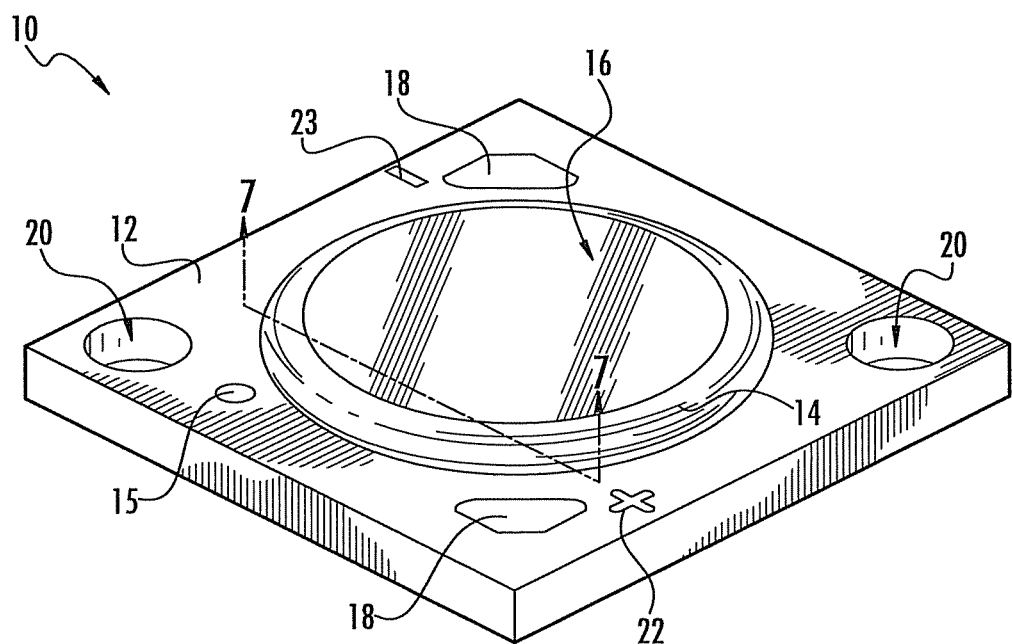
FIG. 1 is a top perspective view of an embodiment of a light emitting device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein can comprise group III-V nitride (e.g., gallium nitride) based light emitting diodes (LEDs) or lasers fabricated on a growth substrate, for example, a silicon carbide substrate, such as those devices manufactured and sold by Cree, Inc. of Durham, N.C. For example, Silicon carbide (SiC) substrates/layers discussed herein can be 4H polytype silicon carbide substrates/layers. Other silicon carbide candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein. For example, sapphire and gallium arsenide can be utilized as growth substrates for fabricating LEDs or lasers as described herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LEDs disclosed herein comprise a growth substrate, it will be understood by those skilled in the art that the crystalline epitaxial growth substrate on which the epitaxial layers comprising an LED are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LEDs according to some embodiments of the present subject matter, for example, can be fabricated on growth substrates (such as a silicon carbide substrates) to provide horizontal devices (with both electrical contacts on a same side of the LED) or vertical devices (with electrical contacts on opposite sides of the LED). Moreover, the growth substrate can be maintained on the LED after fabrication or removed (e.g., by etching, grinding, polishing, etc.). The growth substrate can be removed, for example, to reduce a thickness of the resulting LED and/or to reduce a forward voltage through a vertical LED. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LEDs can be coated, at least partially, with one or more phosphors with the phosphors absorbing at least a portion of the LED light and emitting a different wavelength of light such that the LED emits a combination of light from the LED and the phosphor. In one embodiment, the LED emits a white light which is a combination of light emission from the LED chip and phosphor. One or more LEDs can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LEDs are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LEDs can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LEDs of different colors, one or more of which can be white emitting.

Figure 8:
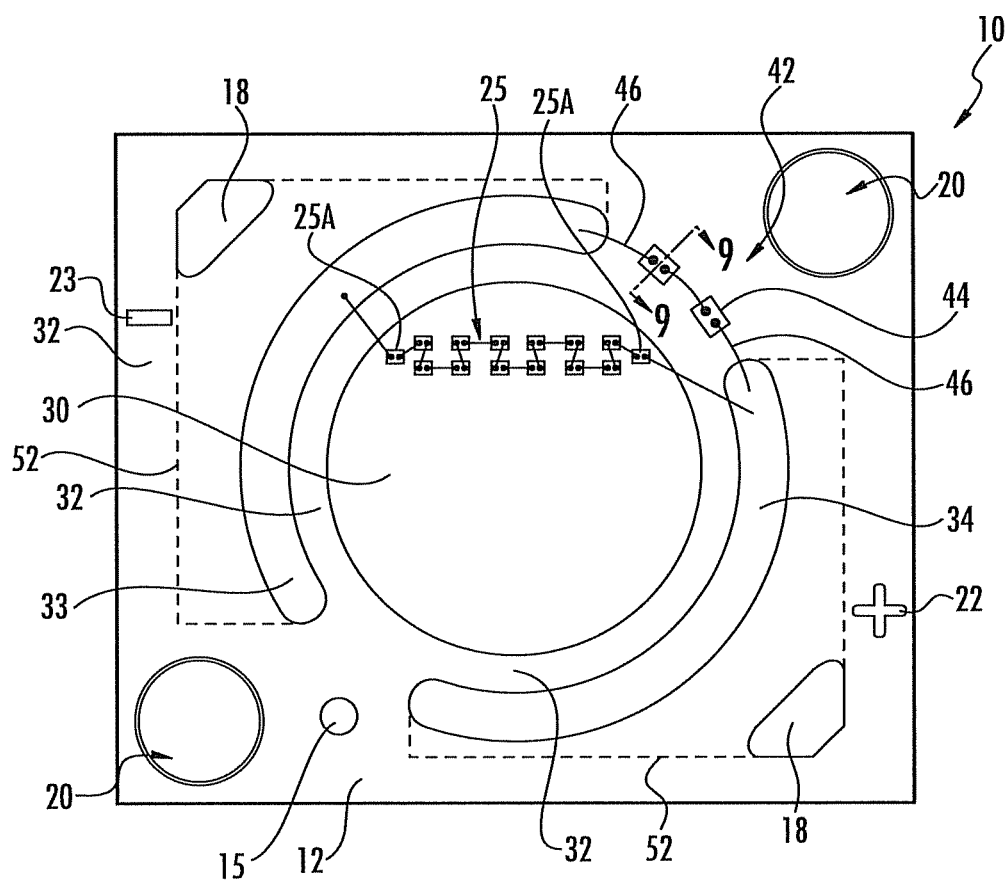
FIG. 8 is a top view of a light emitting device according to the disclosure herein.
Figure 9:
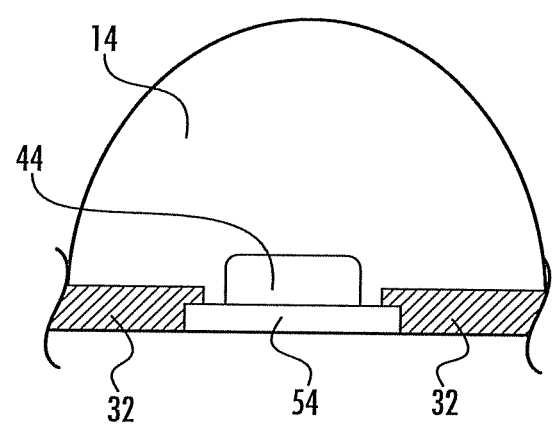
FIG. 9 is a cross-sectional view of a gap area of a light emitting device according to the disclosure herein.

Referring now to FIGS. 1 to 15B, FIG. 1 illustrates a top view of a light emitting or LED device, generally designated 10. LED device 10 can comprise a submount 12 for supporting one or more LEDs. In one aspect, an emission area, generally designated 16, can be disposed over submount 12. In one aspect, emission area 16 can be disposed substantially centrally with respect to LED device 10. In the alternative, emission area 16 can be disposed in any location over LED device 10, for example, in a corner or adjacent an edge. In one aspect, emission area 16 can comprise a substantially circular shape. In other aspects, emission area 16 can comprise any other suitable shape, for example, a substantially square, oval, or rectangle shape. LED device 10 can comprise a single emission area 16 or more than one emission area 16. Notably, LED device 10 can comprise a uniform optical source in the form of emission area which can simplify the manufacturing process for manufacturers of light products requiring a single component. LED device 10 can further comprise a retention material 14 disposed at least partially about emission area 16 where retention material 14 can be referred to as a dam. Retention material 14 can also be disposed over at least one electrostatic discharge (ESD) protection device, such as a Zener diode 44 (FIG. 9). In some aspects, retention material can be disposed over two Zener diodes 44 connected in series between two electrical elements (FIG. 8).

Submount 12 can comprise any suitable mounting submount or substrate, for example, a printed circuit board (PCB), a metal core printed circuit board (MCPCB), an external circuit, or any other suitable submount or substrate over which lighting devices such as LEDs can mount and/or attach. Emission area 16 can be in electrical and/or thermal communication with submount 12. One or more intervening layers can be disposed between emission area 16 and submount 12 such that emission area 16 is indirectly disposed over submount 12 thereby indirectly electrically and/or thermally communicating with submount 12. In the alternative, emission area 16 can directly mount over submount 12 thereby directly electrically and/or thermally communicating, or connecting, with submount 12. In one aspect and for example only without limitation, submount 12 can comprise a compact dimension of 22 millimeter (mm)×22-mm square footprint. In other aspects, submount 12 can comprise any suitable dimension and/or shape, for example, a circular or rectangular shape.

Figure 7:
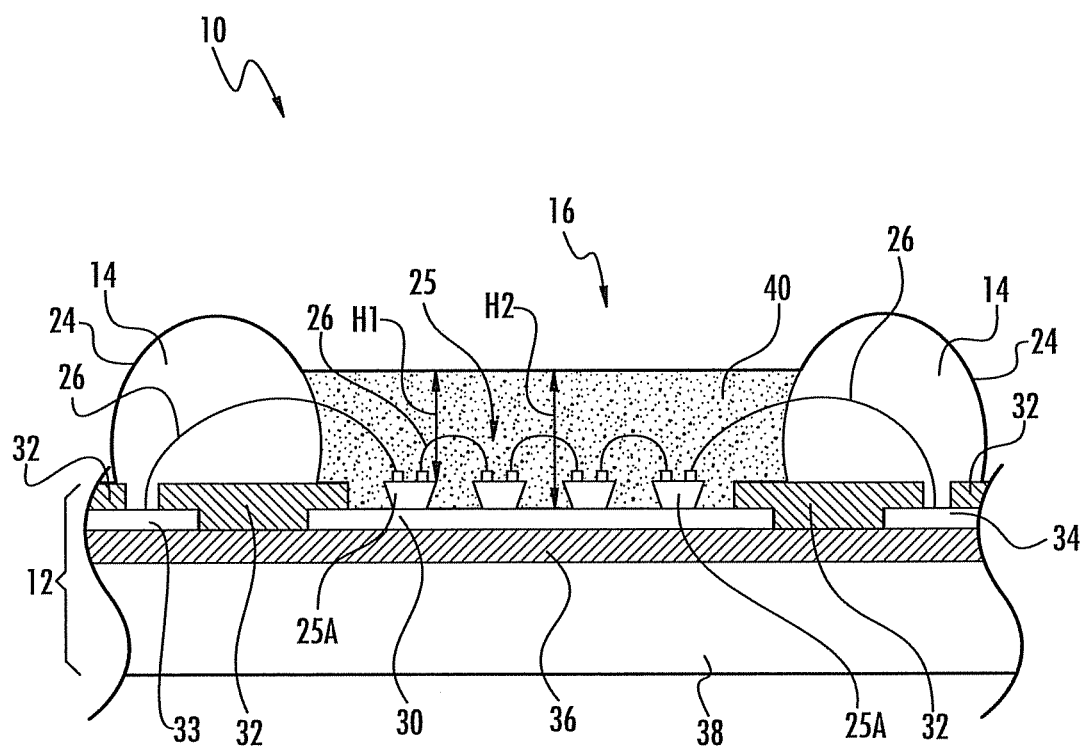
FIG. 7 is a second cross-sectional view of a light emission area of a light emitting device according to the disclosure herein.

Emission area 16 can comprise a plurality of LED chips, or LEDs 25 disposed within and/or below a filling material 40 such as illustrated in FIG. 7. LEDs 25 can comprise any suitable size and/or shape. For example, LEDs 25 can have a rectangle, square, or any other suitable shape. In one aspect, filling material 40 can comprise an encapsulant having a predetermined, or selective, amount of phosphors and/or lumiphors in an amount suitable for any desired light emission, for example, suitable for white light conversion. Filling material 40 can interact with light emitted from the plurality of LEDs 25 such that a perceived white light, or any suitable and/or desirable wavelength of light, can be observed. Any suitable combination of encapsulant and/or phosphors can be used, and combinations of different phosphors for resulting in desired light emission can be used. In other aspects, filling material 40 can comprise a molded lens material. Filling material 40 can be substantially opaque such that emission area 16 can be substantially opaque (as illustrated in FIG. 1), transparent, or semi-transparent depending upon, for example, the amount and type of phosphor used. Retention material 14 can be adapted for dispensing, or placing, about at least a portion of emission area 16. After placement of retention material 14, filling material 40 can be selectively filled to any suitable level within the space disposed between one or more inner walls of retention material 14. For example, filling material 40 can be filled to a level equal to the height of retention material 14 or to any level above or below retention material. The level of filling material 40 can be planar or curved in any suitable manner, such as concave or convex.

Still referring to FIG. 1, LED device 10 can also comprise at least one opening or hole, generally designated 20, that can be disposed through or at least partially through submount 12 for facilitating attachment of LED device 10 to an external substrate or surface. For example, one or more screws can be inserted through the at least one hole 20 for securing device 10 to another member, structure, or substrate. LED device 10 can also comprise one or more electrical attachment surfaces 18. In one aspect, attachment surfaces 18 comprise electrical contacts such as solder contacts. Attachment surfaces 18 can be any suitable configuration, size, shape and/or location and can comprise positive and negative electrode terminals through which an electrical current or signal can pass when connected to an external power source. One or more electrically conductive wires (not shown) can be attached and electrically connected to attachment surfaces 18 when welded, soldered, or any other suitable attachment method known. Electrical current or signal can pass into LED device 10 from the external wires electrically connected to the attachment surfaces 18 and into the emission area 16 to facilitate light output. Attachment surfaces 18 can electrically communicate with emission area 16 which comprises one or more LEDs 25. Attachment surfaces 18 can electrically communicate with first and second conductive traces 33 and 34 (see FIG. 8) and therefore LEDs 25 which may be electrically connected using electrical connectors. Electrical connectors can comprise wirebonds or other suitable members for electrically connecting LEDs 25 to first and second conductive traces 34 and 33.

LED device 10 can further comprise an indicator sign or symbol for denoting the electrical polarity for a given a side of LED device 10. For example, a first symbol 22 can comprise a "+" sign denoting the side of LED device 10 comprising the positive electrode terminal. A second symbol 23 can comprise a "−" sign denoting the side of LED device 10 comprising the negative electrode terminal. One or more test points 15 can be located adjacent either a positive or negative side of the device for testing the electrical and/or thermal properties of the LED device 10. In one aspect, test point 15 can be disposed adjacent the negative side, or terminal of LED device 10.

Figure 2:
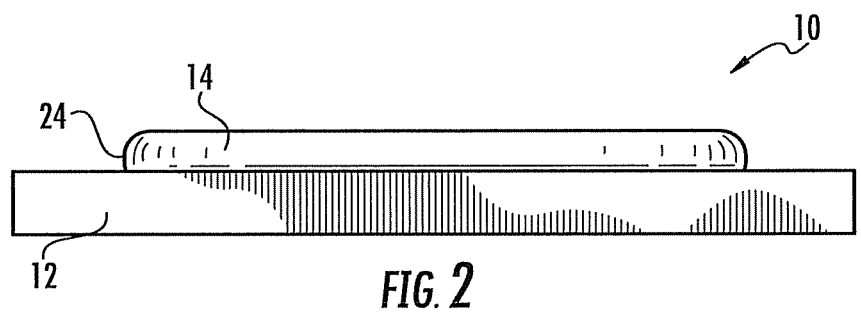
FIG. 2 is a side view of an embodiment of a light emitting device according to the disclosure herein.

FIG. 2 illustrates a side view of LED device 10. As illustrated by FIGS. 1 and 2, retention material 14 can comprise a substantially circular dam disposed about at least a portion of emission area 16 and disposed over submount 12. Retention material 14 can be dispensed, positioned or otherwise placed over submount 12 and can comprise any suitable size and/or shape. Retention material 14 can comprise any suitable reflective material and can comprise a clear or opaque white material such as, for example, a silicone or epoxy material. Filler particles such as titanium dioxide ($TiO_2$), for example, can be used and added to retention material 14 for providing an opaque material. Retention material 14 can be dispensed or deposited in place using an automated dispensing machine where any suitable size and/or shape of dam can be formed. In one aspect, a circular shape as shown can be dispensed, although any other configuration could also be provided such as, for example, a rectangular configuration, a curved configuration and/or any combination of desired configurations and cross-sectional shapes. As FIG. 2 illustrates in a side view of LED device 10, retention material 14 can comprise a rounded outer wall 24 such that the upper surface of retention material 14 opposite submount 12 is rounded. Rounding or curving outer wall 24 of retention material 14 may further improve the amount of light reflected by LED device 10.

Figure 3A:
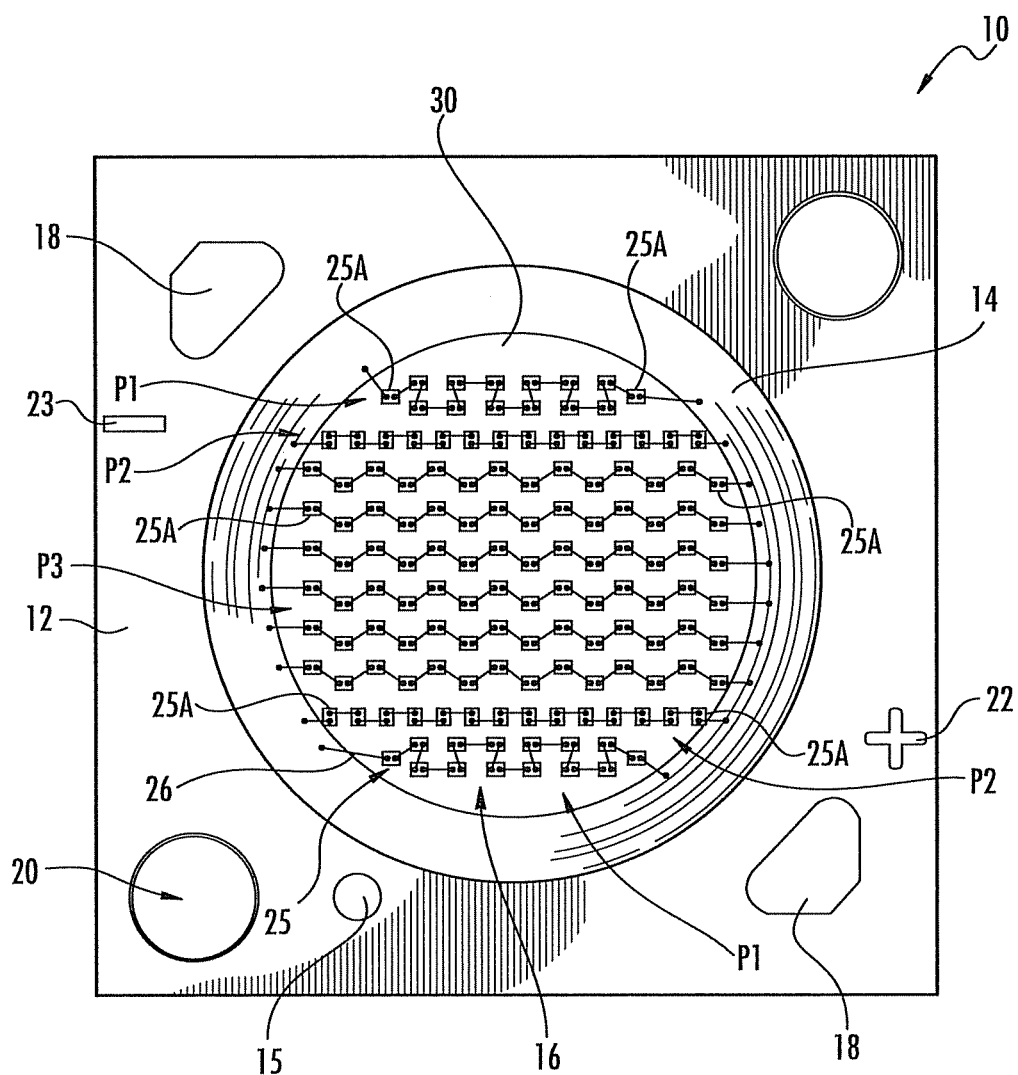
FIGS. 3A and 3B are top views of an embodiment of a light emitting device having one or more patterns of light emitting diodes (LEDs) according to the disclosure herein.
Figure 3B:
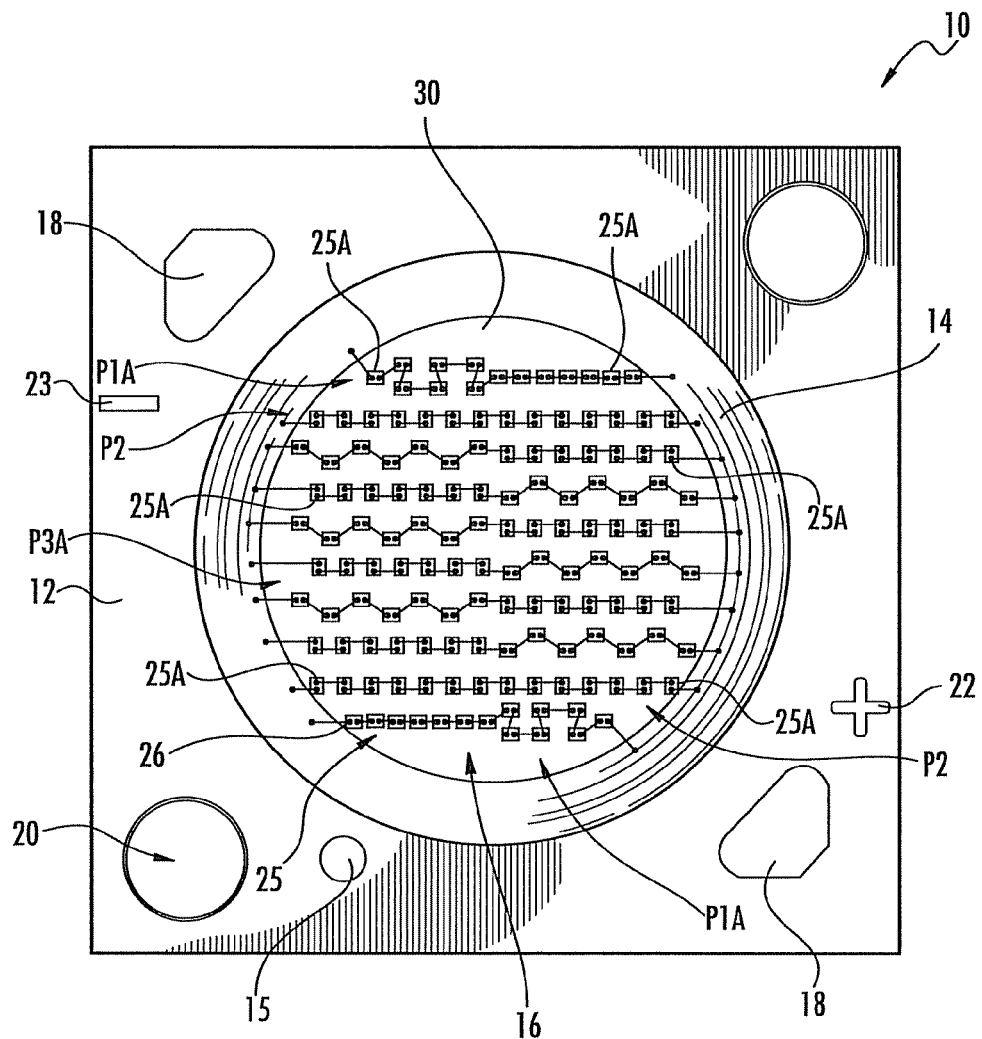

Retention material 14 can comprise any material known in the art, for example, a silicone material comprising 7% fumed silica+3% $TiO_2$+methyl silicone. In one aspect, retention material 14 is adapted to reflect light, and can comprise and/or be coated with a reflective material. As illustrated in FIGS. 3A and 3B, retention material 14 can be dispensed after wirebonding of the one or more LEDs 25 such that retention material 14 is disposed over and at least partially covers wirebonds 26 to contain at least a portion, such as one end of each of wirebonds 26 within retention material 14. In FIGS. 3A and 3B, wirebonds 26 for the electrical ends of the strings of LEDs 25 can be disposed within retention material 14. For example, the electrical ends of the strings can comprise first and last, or outermost edge LEDs 25A for a given set of LEDs such as LEDs 25 are disposed within retention material 14. In one aspect, retention material 14 can be "planed" during dispersion at room temperature for accurate volume and/or height control. The addition of $TiO_2$ can increase reflection about the emission area 16 to further to optimize light emission of LED device 10. Fumed silica can be added as a thixotropic agent. Dispersing retention material 14 can allow increased board space and the ability to withstand higher voltages. In some aspects, LED device 10 can be operable at 42 volts (V) or higher.

Figure 4:
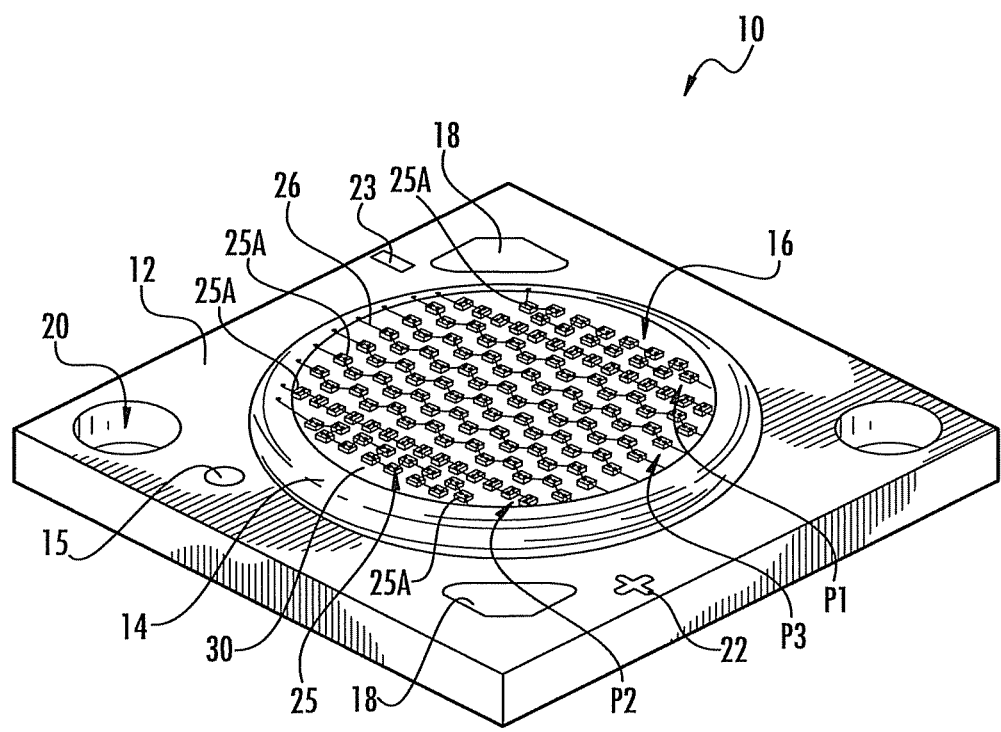
FIG. 4 is a top perspective view of an embodiment of a light emitting device having one or more patterns of LEDs according to the disclosure herein.

FIGS. 3A, 3B and 4 illustrate emission area 16 without a layer of filling material 40. FIGS. 3A and 3B illustrate LED device 10 and emission area 16 comprising at least one pattern, or arrangement, of LEDs. LEDs 25 can be arranged, disposed, or mounted over a conductive pad 30. LEDs 25 can be arranged or disposed in sets of LEDs, that can comprise one or more strings or LEDs, and a given set of LEDs can for example be one or more strings of LEDs electrically connected in series or any other suitable configuration. More than one set of LEDs can be provided, and each set of LEDs can be arranged in parallel to one or more other sets of LEDs. As described further herein, the LEDs in any given set or string of LEDs can be arranged in any suitable pattern or configuration, and even LEDs within a given set or string of LEDs can be arranged or disposed in one or more different patterns or configurations. For example, FIG. 3A illustrates at least three sets of LEDs arranged in three patterns, for example, a first pattern P1, a second pattern P2, and a third pattern P3. Each of patterns P1, P2, and P3 can comprise a consistent pattern design across emission area 16. More than one of patterns P1, P2, and/or P3 can be used. Each of patterns P1, P2, and/or P3 can alternate or be arranged in any suitable configuration. For illustration purposes, only three patterns are illustrated. Any number of patterns or arrangements is contemplated, and patterns can comprise any suitable design, for example, a checkerboard design or a grid design or arrangement wherein the LEDs can be at least substantially aligned in at least two directions. FIG. 3B illustrates at least three sets of LEDs arranged in patterns, for example, a first pattern P1A, second pattern P2, and a third pattern P3A which combine one or more of patterns P1, P2, and P3 illustrated in FIG. 3A. For example, patterns P1A and P3A can comprise a combination of more than one pattern. In one aspect, pattern P1A can comprise a grid arrangement or pattern and a straight line arrangement or pattern. In one aspect, pattern P3A can comprise the checkerboard and straight line pattern designs. Each of patterns P1A and P3A can comprise 14 LEDs 25, seven LEDs of each pattern design. For illustration purposes, only two combinations are illustrated. However, please note that each set of LEDs can comprise a combination of having more than two patterns.

Still referring to FIGS. 3A and 3B, conductive pad 30 can be electrically and/or thermally conductive and can comprise any suitable electrically and/or thermally conductive material. In one aspect, conductive pad 30 can comprise a conductive metal. In one aspect shown in FIG. 3A, emission area 16 can comprise one or more LEDs 25 arranged in a single pattern over conductive surface, or pad 30. In an alternative, LEDs can be provided that are a combination of more than one pattern of LEDs, such as LEDs 25, arranged over conductive pad 30 as FIG. 3B illustrates. As noted above, emission area 16 can comprise a combination of different arrangements or patterns, for example, a combination of first pattern P1, second pattern P2 and/or third pattern P3 for optimizing light emission and device brightness. Each set, or string of LEDs 25 disposed over conductive pad 30 can comprise outermost LEDs 25A with one or more LEDs 25 disposed therebetween. Each string of LEDs 25 can comprise the same or a different pattern, for example, patterns P1, P2, and/or P3. Strings of LEDs 25 can comprise diodes of the same and/or different colors, or wavelength bins, and different colors of phosphors can be used in the filling material 40 (FIG. 7) disposed over LEDs 25 that are the same or different colors in order to achieve emitted light of a desired wavelength. The one or more patterns of LEDs 25 can comprise an array of LEDs within emission area 16.

FIGS. 3A, 3B, and 4 illustrate emission area 16 comprising, for example, 10 lines, or strings, of LEDs 25. Each string of LEDs 25 can comprise any suitable number of LEDs electrically connected between electrical ends, such as outermost LEDs 25A which can connect to respective electrical elements. In one aspect, each string of LEDs 25 can comprise at least 14 LEDs. In one aspect, LED device can comprise at least 140 LEDs arranged in an array. The arrangements, patterns, and/or combination of multiple patterns herein can comprise an array for optimizing color uniformity and brightness of light emitted from LED device 10. The LEDs can be electrically connected in series using one or more wirebonds 26 for attaching bond pads of adjacent LEDs 25. In one aspect as shown in FIG. 3A, first pattern P1 can comprise the first and tenth strings of 14 LEDs 25. First pattern P1 can comprise two opposing lines of LEDs 25 disposed between electrical ends such as the first and last, or outermost LEDs 25A of the series. In one aspect, first pattern P1 comprises what is referred to herein as a grid arrangement, pattern or design, where at least two LEDs are at least substantially aligned in at least two directions and can include single, unaligned LEDs at opposing ends of a set or string of LEDs. Each of the LEDs 25 comprising first pattern P1 can be electrically connected in series. In one aspect, second arrangement or second pattern P2 can be disposed adjacent first pattern P1, for example, located at the second and ninth strings of LEDs 25. In one aspect, second pattern P2 can comprise 14 total LEDs 25 wherein each of the 14 LEDs 25 can be arranged adjacent each other along a horizontal line in a straight line design, or arrangement, and each of the 14 LEDs 25 can be electrically connected in series. Any suitable number of LEDs 25 can be connected in any suitable configuration or arrangement such as in series to form a string having a suitable pattern. Care must be taken when connecting LEDs 25 in series such that the positive or negative electrode of a preceding LED electrically connects to an electrode of opposite electrical polarity for a subsequent LED for allowing electrical current to flow properly through the string of LEDs 25.

Third pattern P3 shown in FIG. 3A can comprise a checkerboard pattern having a checkerboard design, or arrangement of LEDs 25 electrically connected in series. In one aspect, at least 14 LEDs 25 can comprise the checkerboard pattern, and third pattern P3 can be disposed between and/or alternate with strings of LEDs having second pattern P2. The checkerboard pattern or third pattern P3 can comprise a set of LEDs 25 alternating both above and below a horizontal line. Patterns P1, P2, and P3 are not limited in the shape of pattern or to at least 14 LEDs, but rather, patterns can comprise any suitable arrangement and any suitable number of LEDs 25. For illustration purposes, only three patterns are shown although any suitable number of patterns could be utilized. The alternating LEDs 25 of third pattern P3 can optimize light output by ensuring uniform coverage and spatial alignment over conductive pad 30 such that light emission is uniform and improved. Third pattern P3 can repeat from the third through the eighth string of LEDs 25. First and last LEDs 25A in a given string of LEDs 25 for each of patterns P1, P2, and/or P3 can electrically connect to first and second conductive traces 33 and 34 (see FIGS. 7, 8) for receiving and transmitting electrical current or signal through and illuminating a given string of LEDs 25.

The LEDs even in a single set or string in emission area 16 can comprise LEDs in more than one pattern or configuration. For example, FIG. 3B illustrates one aspect of a possible arrangement of LEDs in emission area 16 where there are at least two sets, shown here as strings without limitation, of LEDs 25 and where LEDs 25 for some sets or strings are arranged in different patterns or configurations with respect to another set or string of LEDs and even within one single set or string of LEDs. Any two given separate sets or strings of LEDs 25 can be electrically connected in a pattern such that some or all of the LEDs within each of the two sets or strings of LEDs can be arranged in different patterns, in identical patterns, or in any combination of patterns. In other words, the LEDs in any given set or string can be disposed in different or identical patterns with respect not only to the LEDs in that set or string but can also be disposed in any pattern with respect to another set or string of LEDs and the two sets or strings can in one aspect be parallel to one another. For example, LEDs 25 in FIG. 3B can be disposed in one aspect such that emission area 16 comprises a combination of different arrangements or patterns, for example, a first pattern P1A, a second pattern P2A and/or a third pattern P3A for optimizing light emission and device brightness.

As noted earlier, patterns P1A and P3A illustrate a combination of two different patterns, for example at least two of the checkerboard, straight line and/or grid arrangement, however, combinations of more than two patterns is hereby contemplated. Only three pattern arrangements have been disclosed (i.e., checkerboard, grid, straight line), but any suitable arrangement or pattern design can be used. Each string of LEDs 25 disposed over conductive pad 30 can comprise electrical ends. In one aspect, the electrical ends of the strings can comprise outermost LEDs 25A with one or more LEDs 25 disposed therebetween. Each set or string of LEDs 25 can comprise the same or a different pattern, for example, patterns P1A, P2A, and/or P3A. Sets or strings of LEDs 25 can comprise diodes of the same and/or different colors, or wavelength bins, and different colors of phosphors can be used in the filling material 40 (FIG. 7) disposed over LEDs 25 that are the same or different colors in order to achieve emitted light of a desired wavelength. The one or more patterns of LEDs 25 can comprise an array of LEDs within emission area 16. As FIG. 3B illustrates, for example, in pattern P3A, sets of LEDs 25 can comprise rectangular LEDs arranged where the major (i.e., long) axis of a first LED is disposed in a different orientation than the major axis of at least a second LED. That is, a given set of LEDs 25 can comprise LEDs 25 in different orientations. In other aspects, as illustrated in FIG. 3A for example, pattern P2 and pattern P3 can comprise sets of rectangular LEDs 25 where the major axis is the same is the same for the given set but different from the orientation of other sets.

The various LED arrangements and device designs as described herein are advantageous for providing a light emitting device with excellent performance and output while still being a small light emitting device where pressure exists to provide small devices while maintaining quality performance and light output.

Figure 5:
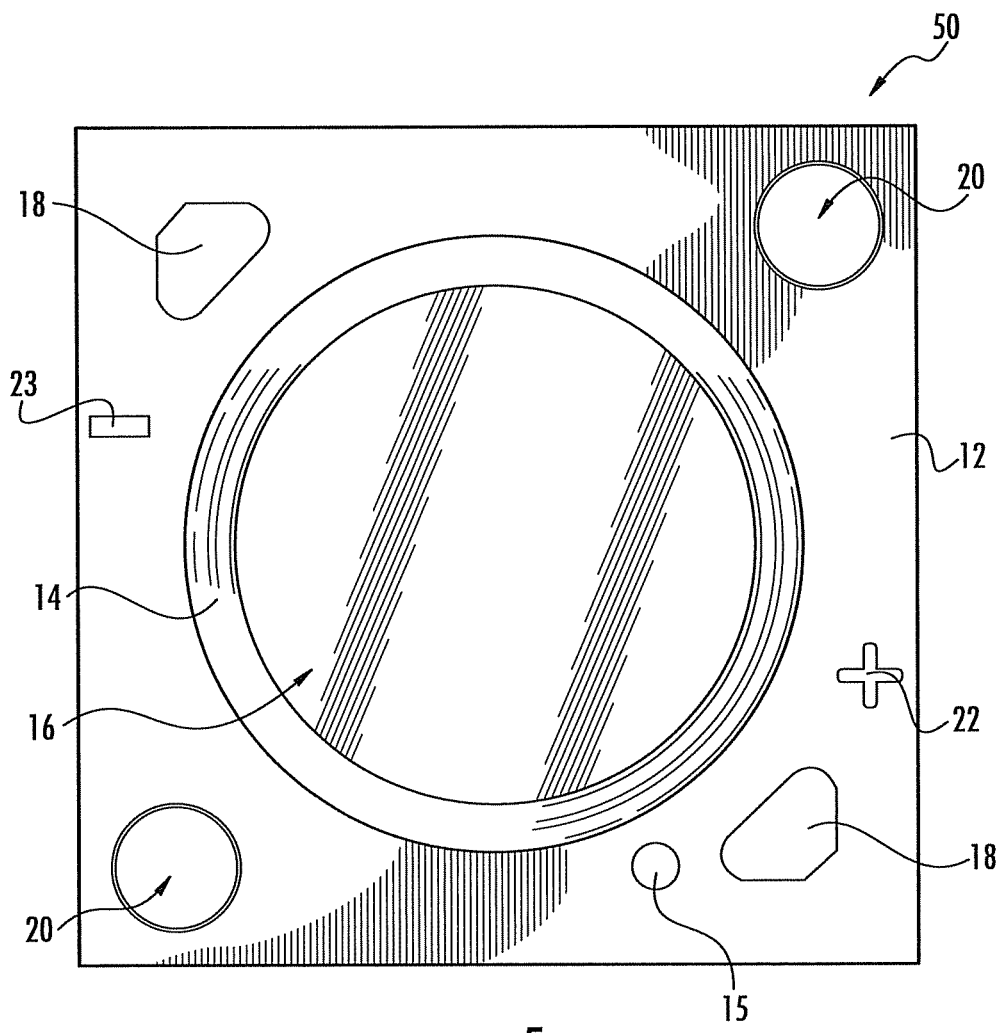
FIG. 5 is a top view of an embodiment of a light emitting device according to the disclosure herein.

FIG. 5 illustrates a second embodiment of an LED device, generally designated 50 which is similar in form and function to LED device 10. LED device 50 can comprise submount 12 and emission area 16 disposed over submount 12. Emission area 16 can comprise any suitable size, shape, number and/or be disposed at any suitable location over submount 12. Retention material 14 can be disposed over submount 12 and at least partially about emission area 16. LED device 50 can comprise one or more openings or holes 20, disposed through submount 12 for facilitating attachment of LED device 10 to an external substrate or surface. LED device 50 can comprise first and second symbols 22 and 23 for denoting the electrical polarity of LED device 50. LED device 50 illustrates test point 15 disposed adjacent the positive or side of the device for testing the electrical and/or thermal properties of the LED device 50. LED device 50 further can comprise at least one electrical attachment surface 18 that can electrically connect to one or more external wires (not shown) for facilitating the flow of electric current into emission area 16 of LED device 50. In one aspect, attachment surface 18 can comprise a shape having curved corners. Rounding the corners, or edges of attachment surfaces 18 may better contain the flow of solder over the device than sharp corners when attaching one or more external conductive wires (not shown) to LED device 50.

Figure 6:
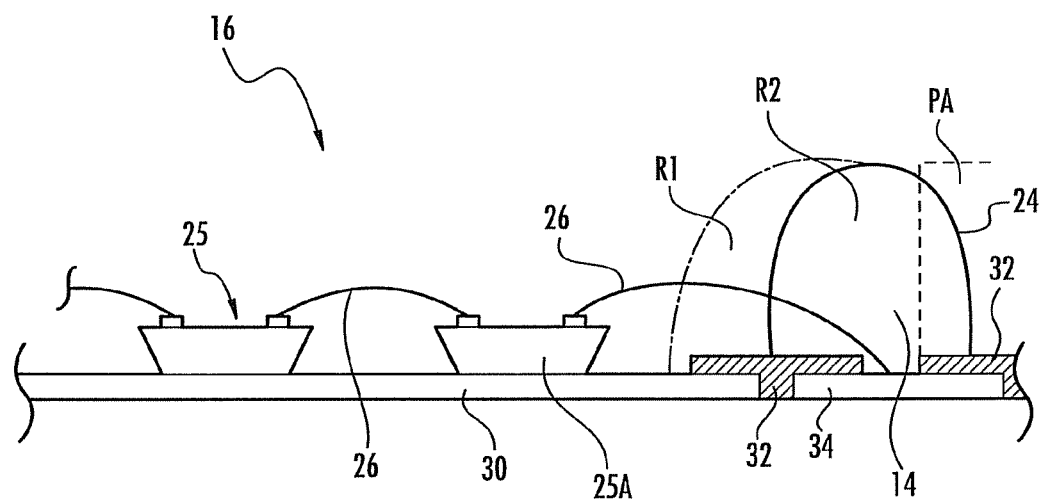
FIG. 6 is a first cross-sectional view of a light emission area of a light emitting device according to the disclosure herein.

FIG. 6 illustrates a portion of a cross-section along an edge of conductive pad 30 of FIGS. 3A and 3B wherein the emission area 16 has not been filled with filling material 40 such as encapsulant and/or phosphors. FIG. 6 illustrates LEDs 25 comprising an outermost LED 25A and adjacent LED for a given string of LEDs within emission area 16. FIG. 7 illustrates a portion of a cross-section of FIG. 1 wherein filling material 40 is disposed over emission area 16. For illustration purposes, four LEDs 25 are illustrated and electrically connected in series in FIG. 7. However, as noted earlier, each string, or pattern of LEDs 25 can comprise any suitable number of LEDs 25. In one aspect, each string of LEDs can comprise 14 LEDs 25. FIGS. 6 and 7 illustrate one or more LEDs 25 connected in series by one or more wirebonds 26. LEDs 25 can be arranged over conductive pad 30 and can thermally communicate directly with conductive pad 30 or indirectly through one or more intervening layers. LEDs 25 can attach to conductive pad 30 or intervening layers using any attachment means known in art. In one aspect, LEDs 25 can attach using solder pastes, epoxies, or flux. Conductive pad 30 can be formed integral as one piece of submount 12 or can comprise a separate layer disposed over submount 12. Conductive pad 30 can dissipate heat generated by the one or more LEDs 25.

As FIGS. 6 and 7 further illustrate, the electrical ends of each string, such as the outermost LEDs 25A for a series, string, or pattern of LEDs 25 can electrically communicate or connect to one or more electrical elements. Electrical elements can comprise first and second conductive traces 33 and 34 configured to flow, or supply electrical signal or current to the respective strings of LEDs 25. One of first and second conductive traces 33 and 34 can comprise an anode and the other a cathode. The electrical polarity can be denoted by first and second symbols 22 and 23 (FIG. 1) as discussed earlier. Conductive pad 30 and conductive traces 33 and 34 can comprise any suitable electrical and thermally conductive materials and can comprise either the same or different materials. In one aspect, conductive pad 30 and conductive traces can comprise a layer of copper (Cu) deposited over a portion of submount (e.g., dielectric layer 36 of FIG. 7) using any suitable technique. An electrically insulating solder mask 32 can be disposed at least partially between conductive pad 30 and respective conductive traces 33 and 34 such that when solder is used to attach one or more LEDs 25 over conductive pad 30, the solder cannot electrically connect with the conductive traces 33 and 34 thereby causing one or more strings of LEDs 25 to become electrically shorted.

FIG. 6 illustrates various placement areas, positions, or locations of retention material 14 about emission area 16. In one aspect, retention material 14 can be dispensed about at least a portion, or entirely about emission area 16. Conventional devices can comprise a molded as opposed to dispensed dam placed at a location such as prior art location PA shown in broken lines in FIG. 6 and disposed along an edge of where solder mask 32 contacts first conductive trace 34. The present subject matter envisions retention material 14 disposed in areas, positions, or locations R1, R2, and/or any location therebetween. When retention material 14 is disposed in locations R1 or R2, it can be disposed over and cover at least a portion of one or more wirebonds 26 connecting outermost LEDs 25A to electrical elements, such as conductive trace 34. When in location R1, retention material 14 can be disposed at least partially over each of solder mask 32 and wirebond 26 connected to outermost LED 25A for a respective string of LEDs 25. In one aspect, retention material 14 can be disposed entirely over the portion of solder mask 32 disposed between conductive pad 30 and conductive trace 34 and/or entirely over wirebond 26 when in location R1. In another aspect, retention material 14 can be disposed over and at least partially or entirely cover each of the wirebonds 26 of each of the outermost LEDs 25A for each string of LEDs 25 disposed in emission area 16. The retention material can be dispensed in a predetermined location on the submount 12 for providing a suitable distance between the retention material 14 and the one or more LEDs 25. Notably, when in location R1, retention material 14 can eliminate the need for solder mask 32 as retention material would be disposed between conductive pad 30 and first and/or second conductive traces 33, 34. Location R2 illustrates retention material 14 disposed at least partially over solder mask 32 and at least partially over wirebond 26 of outermost LED 25A. As illustrated, retention material 14 according to the subject matter herein can comprise a substantially rounded or hemispheric shaped cross-section. Rounding retention material 14 can increase the surface area from which light may be emitted and/or reflected.

FIG. 7 illustrates a string of one or more LEDs 25, for illustration purposes four LEDs 25 are shown but strings of LEDs 25 can comprise any suitable number of LEDs, for example, 14 LEDs 25 arranged in series. FIG. 7 illustrates a cross-section of submount 12 over which LEDs 25 can be mounted or otherwise arranged. Submount 12 can comprise, for example, conductive pad 30, first and second conductive traces 33 and 34, and solder mask 32 at least partially disposed between conductive pad 30 and each of conductive traces 33 and/or 34. As noted earlier, if retention material is positioned adjacent electrical ends of each string (e.g., such as adjacent outermost LEDs 25A), for example in location R1, solder mask 32 between conductive pad 30 and first and second conductive traces 33 and 34 can be eliminated as it would no longer be necessary. Solder mask 32 can be disposed between conductive traces 33 and 34 and attachment surfaces 18 (FIG. 8), the proximal edges of which can be seen in FIG. 7 adjacent retention material 14, adjacent the outer wall 24 of retention material 14. Submount 12 can further comprise a dielectric layer 36, and a core layer 38. For illustration purposes, submount 12 can comprise a MCPCB, for example, those available and manufactured by The Bergquist Company of Chanhassen, Minn. Any suitable submount 12 can be used, however. Core layer 38 can comprise a conductive metal layer, for example Cu or aluminum (Al). Dielectric layer 36 can comprise an electrically insulating but thermally conductive material to assist with heat dissipation through submount 12. FIG. 7 illustrates retention material 14 arranged, for example, in position R2 at least partially over each of solder mask 32 and the wirebond 26 connecting to conductive traces 33 and 34. FIG. 7 illustrates filling material 40 disposed over the one or more LEDs 25. Filling material 40 can be selectively filled to any suitable level higher, lower, or equal to the height of retention material 14. Wirebonds 26 of the outermost LEDs 25A as shown can be at least partially disposed within retention material 14.

FIG. 7 further illustrates examples of first and second heights H1 and H2 of filling material 40 which can be selectively filled within LED device 10. First height H1 can comprise a height at which filling material 40 is disposed over the LEDs 25. The height may vary due to process variability, so an average height above the string of LEDs 25 can be used and controlled for optimal brightness. Second height H2 can comprise a height at which filling material 40 is selectively disposed over a top surface of conductive pad 30. Second height H2 can be controlled, for example, by controlling the location of retention material 14 and whether it assumes location R1, R2 or any position therebetween. Second height H2 can also be controlled by controlling the amount of filling material 40 dispensed into the cavity defined by retention material 14.

Controlling the volume of filling material 40 within the cavity, or dam defined by retention material 14 can affect first and second heights H1 and/or H2 and can notably allow for fine-tuning or micro-tuning the color, or wavelength, of light emitted from LED device 10. Micro-tuning the color of LED devices 10 can therefore ideally increase product yields to 100%. For example, the amount of color affecting components, including but not limited to phosphors, contained in filling material 40 can be selectively added and the first and/or second heights H1, H2 can be selectively controlled by under or over filling the filling material 40 within emission area 16 depending on the wavelength of LEDs 25 used within device 10. Location of retention material 14, for example, locating retention material at R1, R2, or any position or distance therebetween can also affect first and/or second heights H1 and H2. Micro-tuning color can be achieved over multiple devices or on a per device, or package, basis by changing, for example the ratio of volume of phosphor to overall dispense capability volume of filling material 40. The ratio of volume of phosphor to overall dispense capability volume of filling material 40 can be adjusted based on the wavelength bin of LEDs 25 selected for use in a given device to attain the desired overall wavelength output of LED device 10. By manipulating, for example, the diameter of the dam provided by retention material 14 and/or the height of retention material 14, each of which can affect heights H1 and/or H2 and therefore the volume of fill material, the color of individual devices 10 can be micro-tuned thereby attaining higher process yields. Notably, selectively controlling a volume of the fill material such that color-affecting components of the fill material can be fine-tuned allows for light produced by the one or more LEDs to fall within a predetermined and precise color range.

FIG. 8 illustrates LED device 10 comprising submount 12 prior to arranging, dispensing, or otherwise placing retention material 14 about at least a portion of emission area 16. For illustration purposes, only a first string of LEDs 25 is illustrated, however, as noted earlier, emission area can comprise more than one strings of LEDs 25 electrically connected in series. In one aspect, LED device 10 comprises 10 strings of LEDs 25 connected in series. As illustrated, prior to placing retention material 14, submount 12 can comprise first and second conductive traces 33 and 34 arranged in a substantially circular arrangement about conductive pad 30 such that LEDs arranged over conductive pad 30 can electrically communicate to each trace by wirebonding and wirebonds 26 or by any other suitable attachment method. As illustrated, electrical ends of each string can electrically connect to conductive traces. For example, in one aspect electrical ends of each string can comprise outermost LEDs 25A for a respective string of LEDs 25 can electrically connect to conductive traces.

At least one gap 42 can exist between conductive traces 33 and 34. LED device 10 and devices disclosed herein can further comprise elements to protect against damage from ESD positioned, or disposed in the gap 42. In one aspect, different elements can be used such as various vertical silicon (Si) Zener diodes, different LEDs arranged reverse biased to LEDs 25, surface mount varistors and lateral Si diodes. In one aspect, at least one Zener diode 44 can be disposed between ends of first and second conductive traces 33 and 34 and reversed biased with respect to the strings of LEDs 25. In one aspect, two Zener diodes 44 can be electrically connected in series using one or more wirebonds 46 between first and second conductive traces 33 and 34 for higher voltage applications. As Zener diodes 44 are typically black and absorb light, placing the at least one Zener diode 44 in gap 42 between conductive traces 33 and 34 and also beneath retention material 14 can further improve light output intensity.

FIG. 8 also illustrates one possible location for conductive pad 30. That is, conductive pad 30 can comprise a substantially centrally located circular pad disposed between conductive traces 33 and 34. Conductive pad 30 however, can be located at any suitable location over submount and any location other than substantially center the device. Solder mask 32 can be disposed at least partially between respective conductive traces and conductive pad 30, such that the solder mask 32 comprises a substantially circular arrangement about conductive pad 30. Solder mask 32 can also be disposed in areas outside of the conductive traces, for example, between the respective conductive traces and one or more attachment surfaces 18. Broken lines 52 illustrate one possible aspect of the size and/or shape of the electrically and/or thermally conductive material comprising the conductive traces 33 and 34. The lines are broken to illustrate how the material can be disposed under solder mask 32. Thus, attachment surfaces 18 electrically and/or thermally communicate with respective conductive traces, and can comprise the same layer of material. External, conductive wires (not shown) can electrically connect to attachment surfaces 18, and electrical current or signal can flow from the attachment surfaces 18 to the respective conductive traces. The electrical current can flow along the conductive material designated by dotted lines 52 disposed below the layer of solder mask 32. The electrical current can flow into and/or out of the conductive traces and therefore into and out of respective strings of LEDs 25 mounted over conductive pad 30.

As noted earlier, Zener diodes 44 are typically black and absorb light. FIG. 9 illustrates Zener diode 44 upon placement of the retention material. In one aspect, retention material 14 can be disposed at least partially over the at least one Zener diode 44. In another aspect, retention material 14 can be disposed entirely over the at least one Zener diode 44 such that the diode is completely covered for further improving light output intensity. Zener diode 44 can be disposed over an electrically and/or thermally conductive surface or area 54 such that current can flow through the diode 44, into the wirebonds 46, and to respective conductive traces 33 and 34.

LED devices disclosed herein can advantageously consume less energy while delivering equal or greater illumination. In one aspect, when used in traditional downlight applications, luminaires based on LED devices 10 and/or 50 can deliver 38% more illumination than a 26-watt CFL or a 100-watt incandescent bulb, while consuming only 14 watts. In one aspect, LED device 10 can enable a 60-watt A-lamp equivalent while consuming only 11 watts. LED device 10 can comprise a light output of 1050 lumens at 11 watts, or 2000 lumens at 27 watts, with a 3000-K warm-white color temperature.

Figure 10:
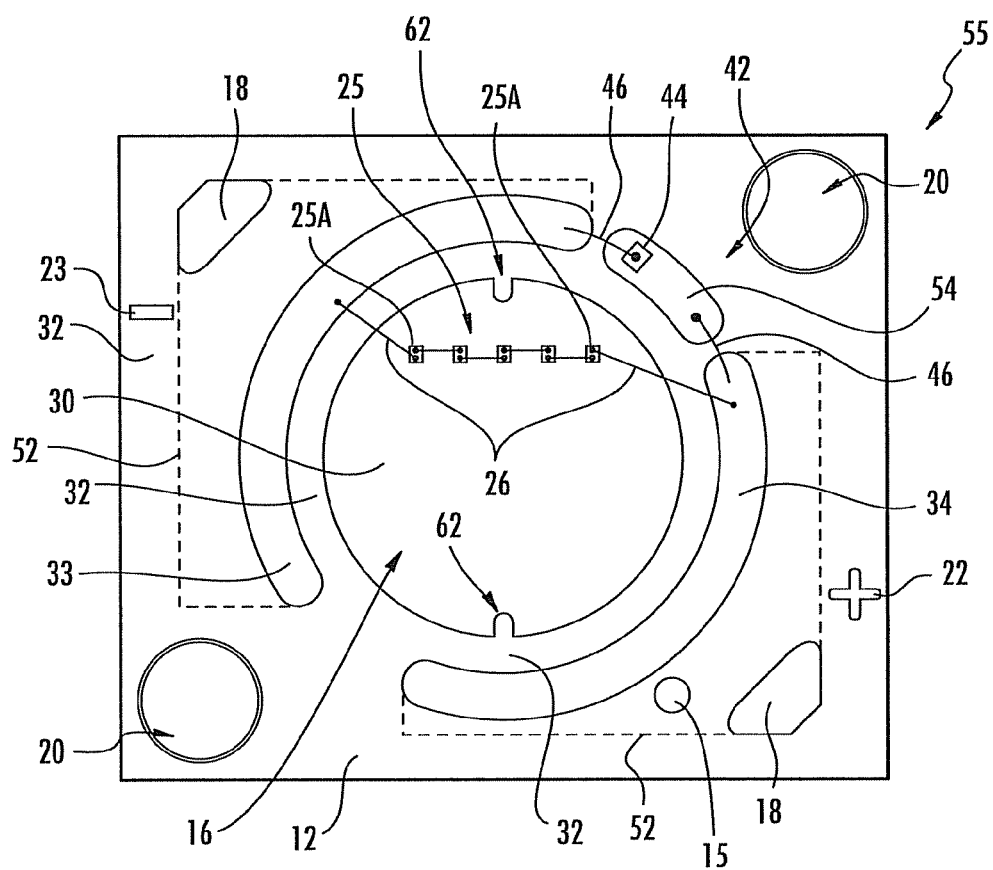
FIG. 10 is a top view of a light emitting device according to the disclosure herein.

FIG. 10 illustrates another embodiment of an LED device, generally designated 55. LED device 55 illustrates submount 12 prior to arranging, dispensing, or otherwise placing retention material 14 (FIG. 11) about at least a portion of emission area 16. For illustration purposes, only a first string of LEDs 25 is illustrated, however, emission area can comprise more than one string of LEDs 25 electrically connected in series. Each string of LEDs 25 can comprise the same or a different pattern. Prior to placing retention material 14, submount 12 can comprise first and second conductive traces 33 and 34 arranged in a substantially circular arrangement about conductive pad 30 such that LEDs arranged over conductive pad 30 can electrically communicate to each trace by wirebonding via wirebonds 26 or any other suitable attachment method. As illustrated, outermost LEDs 25A for a respective string of LEDs 25 can electrically connect to the conductive traces. In fact, for LED devices described herein, emission area 16 can comprise a single, undivided mounting area at least partially defined by outermost LEDs 25A, with the outermost LEDs 25A being wirebonded via wirebonds 26 to contact areas, such as conductive traces 33 and 34. LEDs 25 that are not the outermost LEDs 25A are wirebonded via wirebonds 26 in strings having one or more patterns or arrays.

At least one gap 42 can exist between conductive traces 33 and 34. In this embodiment, one or more ESD protection device or Zener diode 44 can be disposed in gap 42 and can be electrically connected, or mounted to conductive area 54. In this embodiment, conductive area 54 can comprise an area larger than a footprint of Zener diode 44. Zener diode 44 can be positioned over conductive area 54 between ends of first and second conductive traces 33 and 34. Zener diode 44 can be reversed biased with respect to the one or more strings of LEDs 25. For example, when one Zener diode 44 is used, one or more wirebonds 46 can connect conductive area 54 to one of first and second conductive traces 33 and 34 such that Zener diode 44 can be reverse biased with respect to the strings of LEDs 25. As Zener diodes 44 are typically black and absorb light, placing the at least one Zener diode 44 in gap 42 between conductive traces 33 and 34 and also beneath retention material 14 (FIG. 9) can further improve light output intensity.

FIG. 10 also illustrates one possible location for test point 15. Test point 15 can be disposed within the area marked by broken lines 52 which correspond to conductive material disposed under solder mask. Broken lines 52 illustrate one possible aspect of the size and/or shape of the conductive material which can be deposited on or in submount 12 for electrically coupling conductive traces 33 and 34 and attachment surfaces 18. The electrical coupling allows electrical current to be communicated from attachment surfaces 18 to the one or more strings of LEDs 25 electrically connected to traces 33 and 34. The lines are broken to illustrate how the material can be disposed under solder mask 32. Thus, test point 15 and attachment surfaces 18 electrically and/or thermally communicate with respective conductive traces, and can comprise the same layer of material. Solder mask 32 can be deposited or disposed at least partially between respective conductive traces and conductive pad 30, such that the solder mask 32 comprises a substantially circular arrangement about conductive pad 30. Conductive pad 30 can comprise one or more marks or notches 62 for orientation purposes and for proper alignment of retention material 14.

Solder mask 32 can also be deposited in areas outside of the conductive traces, for example, between the respective conductive traces and one or more attachment surfaces 18 and/or test point 15. External, conductive wires (not shown) can electrically connect to attachment surfaces 18, and electrical current or signal can flow from the attachment surfaces 18 to the respective conductive traces. The electrical current can flow along the conductive material designated by dotted lines 52 disposed below the layer of solder mask 32. The electrical current can flow into and/or out of the conductive traces and therefore into and out of respective strings of LEDs 25 mounted over conductive pad 30. In one aspect, test point 15 can allow thermal properties of the device to be tested when probed with any suitable temperature sensor (not shown). The arrangement illustrated by FIG. 10, i.e., the location of conductive traces 33 and 34, conductive area 54, Zener diode 44, and test point 15 prior to placing retention material 14 can correspond to any one of the previously described LED devices e.g., 10 and 50 or any of the devices described in FIGS. 11-14. For example, LED devices described in FIG. 11-14 can comprise at least one opening or hole, generally designated 20, that can be disposed through or at least partially through submount 12 for facilitating attachment of the LED devices to an external substrate or surface. In addition first symbol 22 and second symbols can be used to denote the portions of the LED devices comprising positive and negative electrode terminals. One or more test points 15 can be located adjacent either a positive or negative side of the device for testing the electrical and/or thermal properties of the LED devices.

Figure 11:
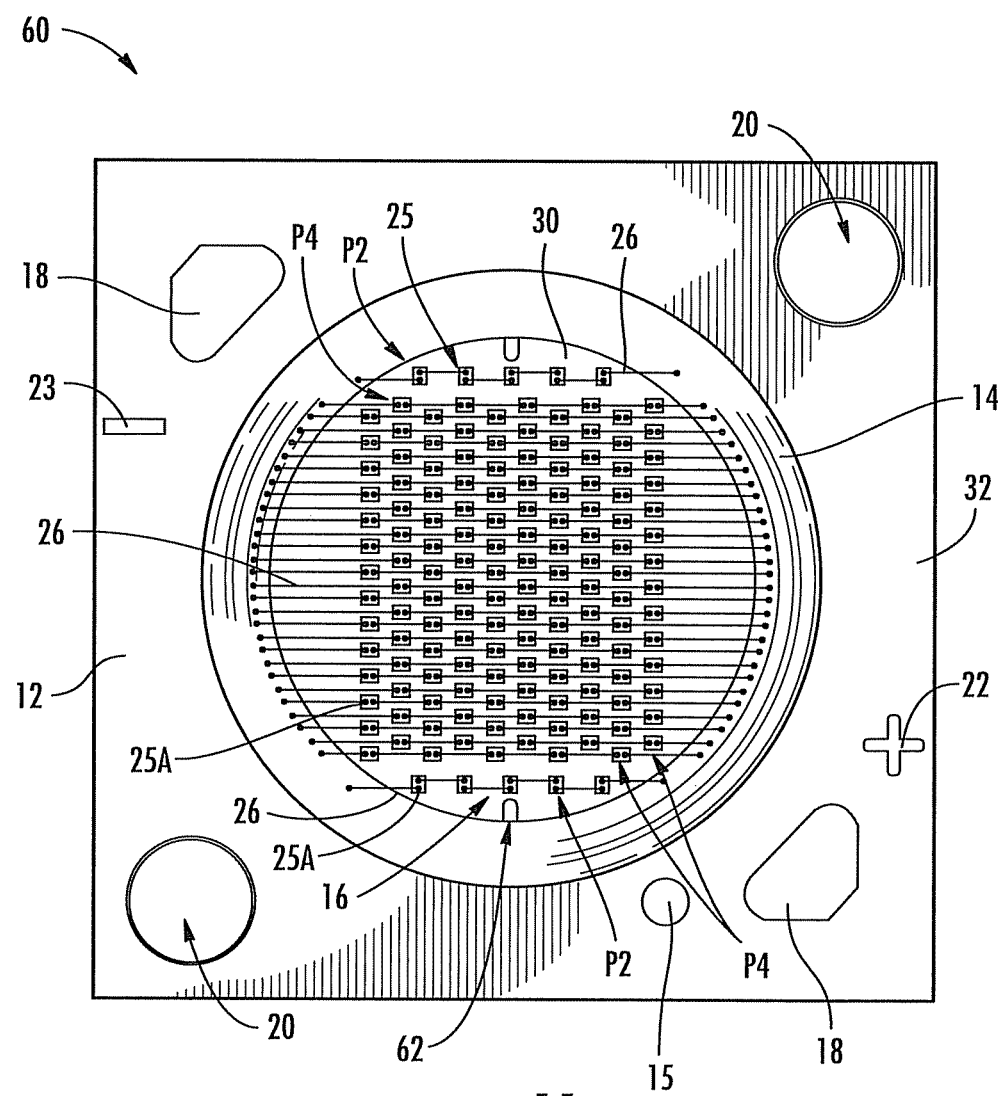
FIGS. 11 to 14B are top views of embodiments of a light emitting device having one or more patterns of LEDs according to the disclosure herein.

FIGS. 11 to 14 illustrate top views of different embodiments of LED devices. Such devices can be similar in many aspects to previously described LED devices 10 and 50, but can also be useful for a range of low and/or high voltage applications in addition to attaining different light output by pattern variation. For example, FIG. 11 illustrates one embodiment of an LED device, generally designated 60 which can be used in lower voltage applications. In one aspect and for example only without limitation, LED device 60 can be operable at approximately 16 V. In one aspect, LED device 60 can be operable at less than approximately 16 V, for example, 14 to 16 V. In one aspect, LED device 60 can be operable at more than approximately 16 V, for example, 16 to 18 V. In one aspect, using more than 140 LEDs 25, e.g., more than LED device 10 and changing the pattern of LEDs 25 can allow LED device 60 to be operable at lower voltage applications. In one aspect, the pattern can be changed by electrically connecting less than 14 LEDs 25 together in a series or string.

FIG. 11 illustrates at least two sets of LEDs arranged in two patterns forming a reticulated array of LEDs 25 within emission area 16. For example, a first set of LEDs can comprise second pattern P2, previously described. A second set of LEDs can comprise a fourth pattern P4. Each pattern can comprise, for example, 30 strings of five LEDs 25 electrically connected in series. That is, fewer than 14 (FIGS. 3A, 3B) LEDs 25 can be electrically connected in series in a given string. The first and last strings of LEDs 25 can comprise five LEDs 25 electrically connected in series according to previously described second pattern P2. The second to twenty-ninth strings can comprise another pattern different from the first and thirtieth strings. For example, FIG. 11 illustrates five LEDs 25 electrically connected in series according to pattern P2, the strings can be disposed on conductive pad 30 proximate one or more rounded outer edges of emission area 16. LEDs 25 arranged in the first and thirtieth strings can, for example and without limitation, be spaced equidistant from each other and uniformly across emission area 16 according to pattern P2. LEDs 25 arranged in pattern P2 can comprise a straight line arrangement in which longer axes of LEDs 25 are substantially parallel. The shorter axes of LEDs 25 in pattern P2 can also be at least substantially parallel. Longer axes of LEDs 25 arranged in pattern P2 can be aligned perpendicular to wirebonds 26. In addition, longer axes of LEDs 25 arranged in pattern P2 can be perpendicular to longer axes of LEDs 25 arranged in adjacent patterns, e.g., pattern P4.

In one aspect, pattern P4 can comprise five LEDs 25 electrically connected in series across conductive pad 30. Pattern P4 can comprise a straight line of LEDs, and each of the five LEDs 25 can be positioned such that longer axes of LEDs 25 are substantially aligned along a straight line. In one aspect, longer axes of each LED 25 can be aligned in a same direction as the direction of wirebonds 26 connecting the LEDs 25 to conductive traces 33 and 34 disposed below retention material 14. Adjacent strings, e.g., adjacent strings in the second through twenty-ninth strings of LEDs 25 connected in pattern P4 can alternate above and below a straight line such that the LEDs 25 form a substantially checkerboard type arrangement. That is, a first string of LEDs 25 arranged in pattern P4 (i.e., the second overall string of LEDs 25 disposed below the first string comprising pattern P2) can comprise five LEDs 25 spaced equidistant apart, leaving a space in between adjacent LEDs 25. In the alternative, LEDs 25 in pattern P4 could be wirebonded in a checkerboard arrangement, but that could increase the voltage at which device 60 is operable. Below the first string of LEDs 25 arranged in pattern P4, a subsequent string of LEDs 25 arranged in pattern P4 can be positioned or placed such that the LEDs 25 are substantially within and/or slightly below the space between adjacent LEDs 25 of the preceding string. That is, LEDs 25 arranged in pattern P4 can comprise a first string aligned such that a bottom edge of each LED 25 in the string is aligned along a same first straight line. LEDs 25 in a neighboring subsequent string of pattern P4 can be aligned such that a top edge of each LED 25 is also aligned along the same first straight line as the bottom edge of LEDs 25 in the preceding string. Thus, LEDs 25 of preceding and subsequent strings alternate above and/or below spaces between adjacent LEDs 25 in a given string, and the top and bottom edges of LEDs 25 in adjacent strings can be aligned along a same line. This arrangement comprises a substantially checkerboard shaped orientation which can advantageously allow LEDs 25 to uniformly emit light from LED device 60 without one or more adjacent LEDs blocking light.

Additional strings of LEDs 25 arranged in pattern P4 can alternate according to the first two strings just described. Strings of LEDs 25 comprising pattern P4 can comprise a same or similar width over emission area 16. That is, each adjacent LED 25 of a given string can be spaced apart at equidistant lengths, but the overall string length may not be uniformly across emission area 16. Rather, LEDs 25 can be spaced such that the second to twenty-ninth strings or rows can form a substantially reticulated array over emission area 16. In one aspect, LEDs 25 form a rectangular array over emission area 16 which utilizes a substantially uniform portion of horizontal segments, or chords of conductive pad 30. In one aspect, LED device 60 can comprise at least one group of LEDs 25 arranged in more than one string of LEDs, where the overall configuration can be in a predetermined geometrical shape, such as for example and without limitation, a rectangle. Any suitable number of LEDs 25 can be connected in series. Fewer number of LEDs 25, for example five LEDs 25 connected in series as illustrated in FIG. 11 can allow LED device 60 to be suitable for lower voltage applications, for example 16V applications. For illustration purposes, 30 strings of five LEDs 25 arranged in one or more patterns are illustrated for operation at lower voltages, however, any suitable number of strings and/or LEDs 25 electrically connected in series is contemplated.

LED device 60 can comprise outermost LEDs 25A electrically connected via electrical connectors such as wirebonds 26 to conductive traces 33, 34 (FIG. 10). Retention material 14 can then be dispensed at least partially about conductive pad 30 and at least partially over wirebonds 26. Retention material 14 can be dispensed about emission area 16 which can comprise a plurality of LED chips, or LEDs 25 disposed within and/or below filling material 40 such as illustrated in FIG. 7. Filling material 40 can be at least partially contained by retention material 14, and retention material can be used to control or adjust various heights of filling material as may be desirable. Notably, LED device 60 can comprise a uniform optical source in the form of single, cohesive, and undivided emission area which can simplify the manufacturing process for manufacturers of light products requiring a single component. LEDs 25 can be spaced a suitable distance apart such that device 60 can advantageously emit uniform light without having any light blocked by one or more adjacent LEDs 25. The patterns and pattern spacing (i.e., spacing between adjacent LEDs 25 and spacing between adjacent strings of LEDs 25) disclosed for example in LED devices 10 and 60 allow for optimization of light extraction by reducing the amount of light blocked by adjacent LEDs 25 and adjacent strings of LEDs 25. The pattern spacing disclosed for example in LED devices 10 and 60 can further be configured and expanded, for example, by increasing the spacing between adjacent LEDs 25 (e.g., to pattern spacing illustrated in FIGS. 12-14B) to maximum spacing within a given string and between one or more strings to further maximize and attain a higher efficiency and light extraction within a given LED device.

Figure 12:
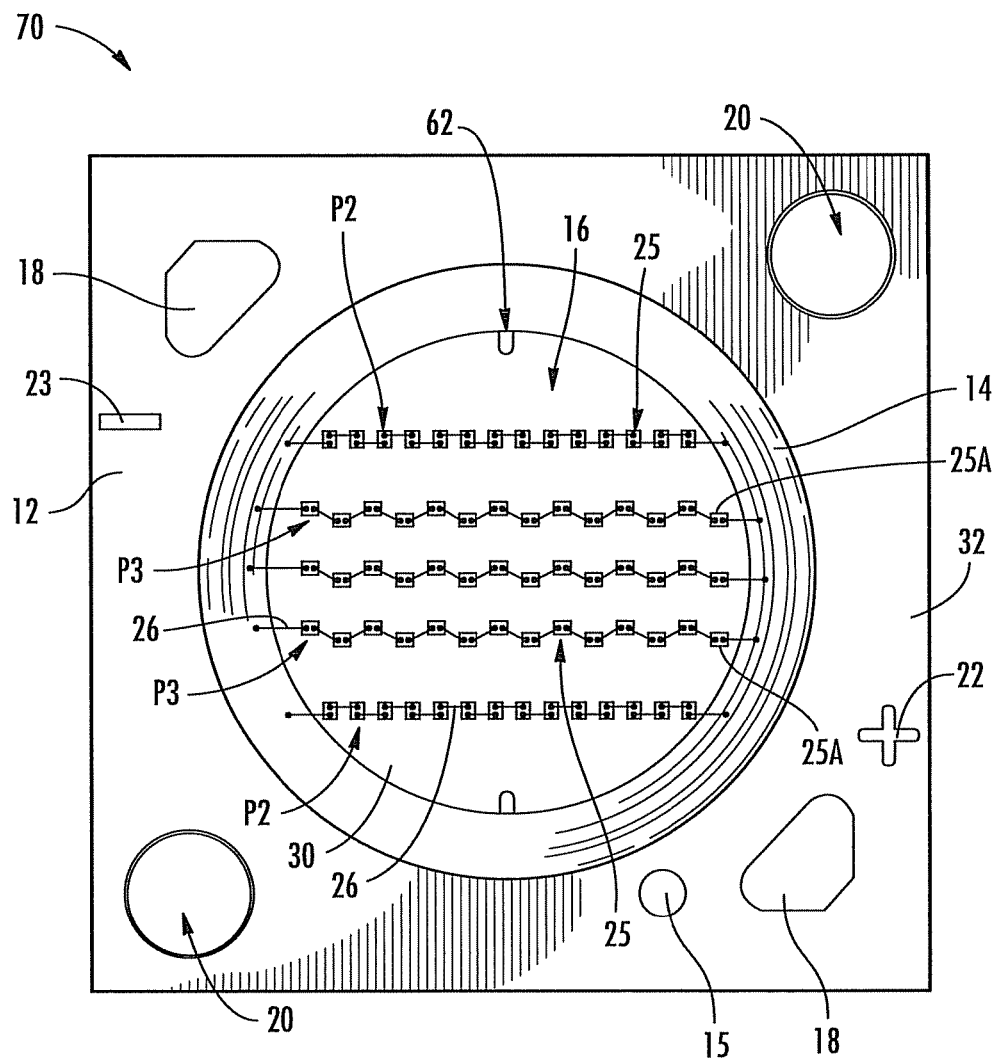

FIGS. 12 to 14B illustrate top views of LED devices which can be operable at higher voltages such as, for example only and not limited to approximately 42 V. In one aspect, LED devices illustrated by FIGS. 12 to 14B can comprise more than five LEDs 25 per string such that the device is configured to operate at greater than approximately 16 V. FIG. 12 illustrates an LED device generally designated 70 having, for example, five strings of 14 LEDs 25. LED device 70 can comprise strings of LEDs 25 arranged in one or more different patterns. For example, the first and last strings proximate rounded edges of conductive pad 30 can comprise 14 LEDs 25 arranged in previously described pattern P2. The longitudinal axes of adjacent LEDs 25 in pattern P2 can be aligned such that they are at least substantially parallel. The longitudinal axes of adjacent LEDs 25 in pattern P2 can be at least substantially perpendicular to the direction of wirebonds 26 connecting adjacent LEDs 25. For each LED device described, any shape, orientation, or structure of LEDs is contemplated. In one aspect, LED device 70 can comprise 70 total LEDs 25.

Still referring to FIG. 12, strings of LEDs 25 disposed between outermost strings of second pattern P2 can comprise a different pattern, for example, third pattern P3 previously described in FIGS. 3A and 3B. Third pattern P3 can comprise a substantially checkerboard pattern or arrangement of LEDs 25 electrically connected in series. In one aspect, pattern P3 can be disposed between and/or alternate with strings of LEDs having second pattern P2. The checkerboard pattern or third pattern P3 can comprise a set of LEDs 25 alternating both above and below a horizontal line. LED device 70 can be disposed uniformly across emission area 16 and/or conductive pad 30, for example. In general, adjacent LEDs 25 in each of the strings of LED device 70 can be spaced at equidistant intervals to utilize a substantial portion of horizontal segments of conductive pad 30. That is, LEDs 25 in device 70 can occupy a greater amount of surface area and length of horizontal segments of conductive pad 30 than previously described LED device 60. For illustration purposes, five strings of 14 LEDs 25 arranged in two different patterns are illustrated, however, any suitable number of strings and/or LEDs 25 electrically connected in series is contemplated.

Figure 13A:
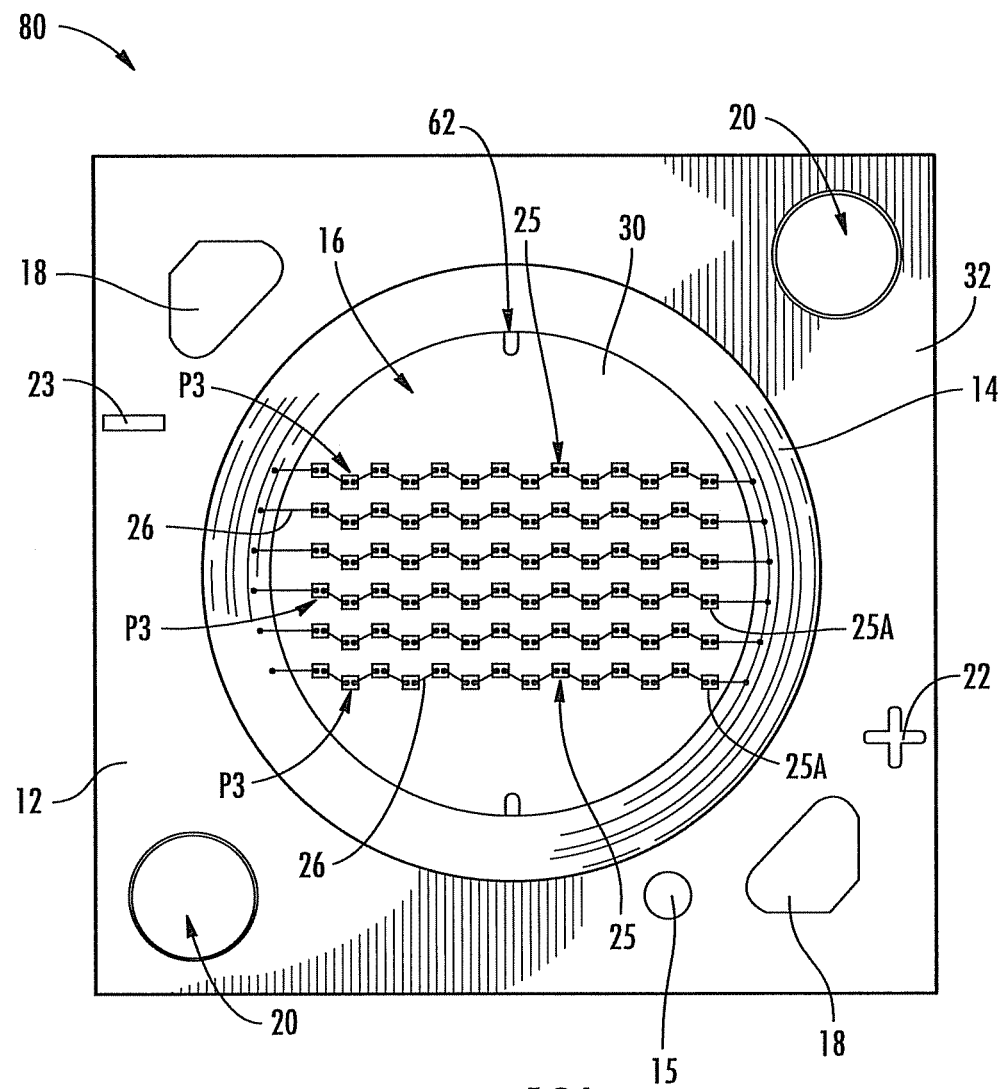
Figure 13B:
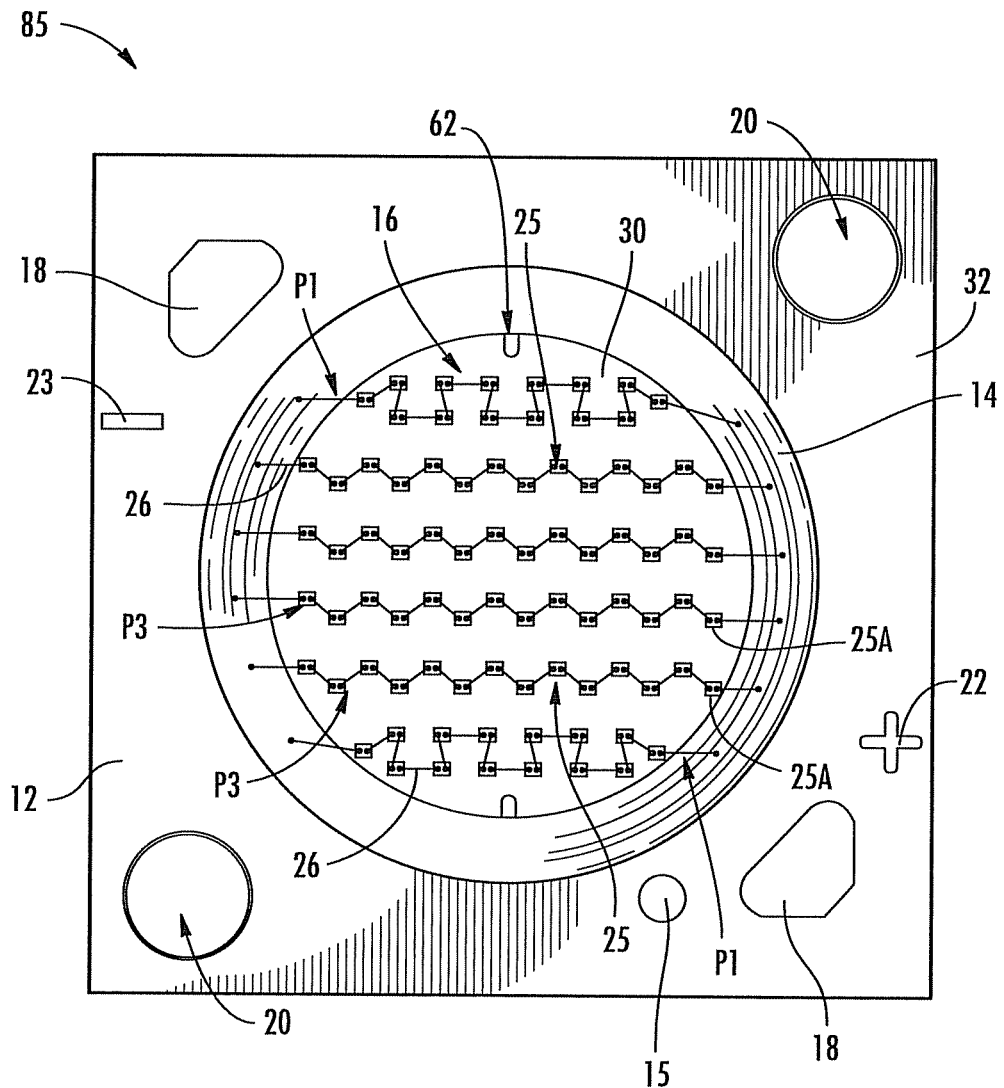

FIGS. 13A and 13B illustrate further embodiments of LED devices. In one aspect, LED devices in FIGS. 13A and 13B comprise six strings of 14 LEDs 25, for a total of 84 LEDs 25. Referring to FIG. 13A, LED device, generally designated 80 can comprise one or more strings of LEDs 25 arranged for example in a single pattern across conductive pad 30. The one or more strings of device 80 can have the same and/or different patterns. For illustration purposes, previously described pattern P3 is illustrated. LEDs 25 can be arranged in a checkerboard pattern alternating above and below a horizontal line. Adjacent LEDs 25 can be spaced a substantially uniform distance from each other across a large portion of the surface area of conductive pad 30. Checkerboard arrangements, e.g., pattern P3 can advantageously allow the LEDs 25 to uniformly emit light from LED device 80 without one or more adjacent LEDs 25 blocking light.

FIG. 13B illustrates another embodiment of a six string LED device, generally designated 85. Like LED device 80, LED device 85 can comprise six strings of 14 LEDs 25. Spacing between adjacent LEDs 25 within the same string and adjacent LEDs 25 within different strings has been maximized to minimize the amount of light absorbed by adjacent LEDs. In one aspect, LED device 85 comprises previously illustrated first pattern P1 (FIG. 3A) as the first and last strings. Notably, LEDs 25 of patterns P1 and P3 extend at least substantially the full length and width of conductive pad 30. The second through fifth strings of LEDs 25 within LED device 85 comprise pattern P3. When comparing the six string arrangement of FIG. 13A to the six string arrangement of FIG. 13B, it is apparent that the strings of FIG. 13B are more spread out, i.e., vertically and horizontally spaced further apart on conductive pad 30 to utilize more of the mounting area. Maximizing the space between strings of LEDs 25 can minimize the amount of light absorbed or blocked by neighboring LEDs 25.

In one aspect, inter-string spacing, that is, spacing between adjacent LEDs 25 of the same string has been increased by at least approximately 31%, or by 125 µm, or greater in the vertical direction for pattern P3 from LED device 80 to LED device 85. Similarly, inter-string spacing of LEDs 25 in pattern P1 has been increased and/or optimized in both the horizontal and vertical directions. For example, spacing has been increased approximately 41%, or by 225 µm, or greater, in the horizontal direction and by at least approximately 27%, or by 210 µm, or greater in the vertical direction from P1 in LED device 10 to P1 in LED device 85. Intra-string spacing i.e., spacing between LEDs 25 of adjacent strings can be increased by at least approximately 68%, or by 750 µm, or greater in LED device 85. Notably, although LED device 85 can comprise the same number of LEDs 25 as LED device 80, e.g., 84 LEDs, LED device 85 can comprise at least approximately a 1% to 3%, or greater, increase in efficiency and brightness when compared to LED device 80. In one aspect, increasing the spacing between adjacent LEDs 25 as described can increase the efficiency by at least approximately 2.5% or greater from one six string arrangement to another, e.g., LED device 85 can comprise a 2.5% or greater increase in efficiency over LED device 80. For example, LED device 85 can have a light output of at least approximately 2.5% or higher than the light output of LED device 80 described above, which can comprise approximately 1050 lumens or more at 11 watts, or approximately 2000 lumens or more at 27 watts.

Figure 14A:
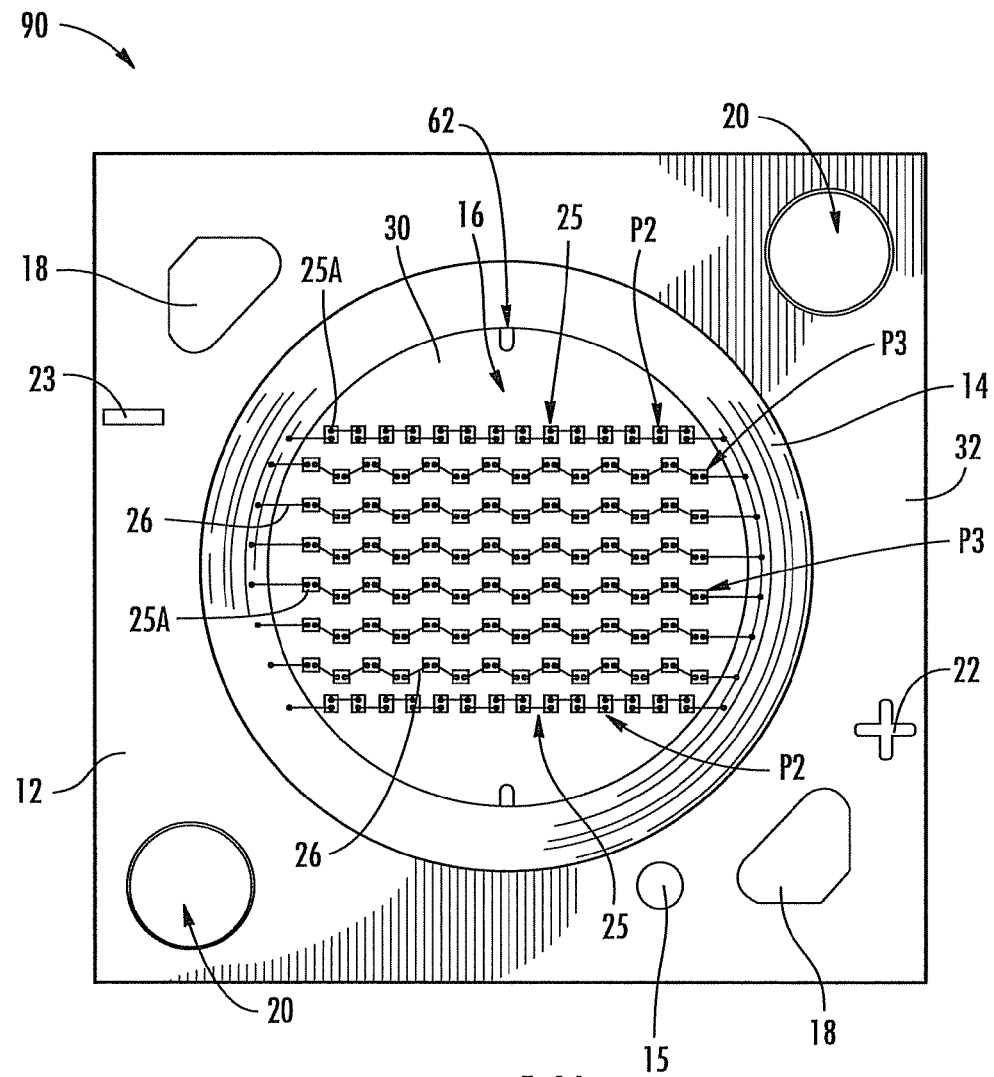
Figure 14B:
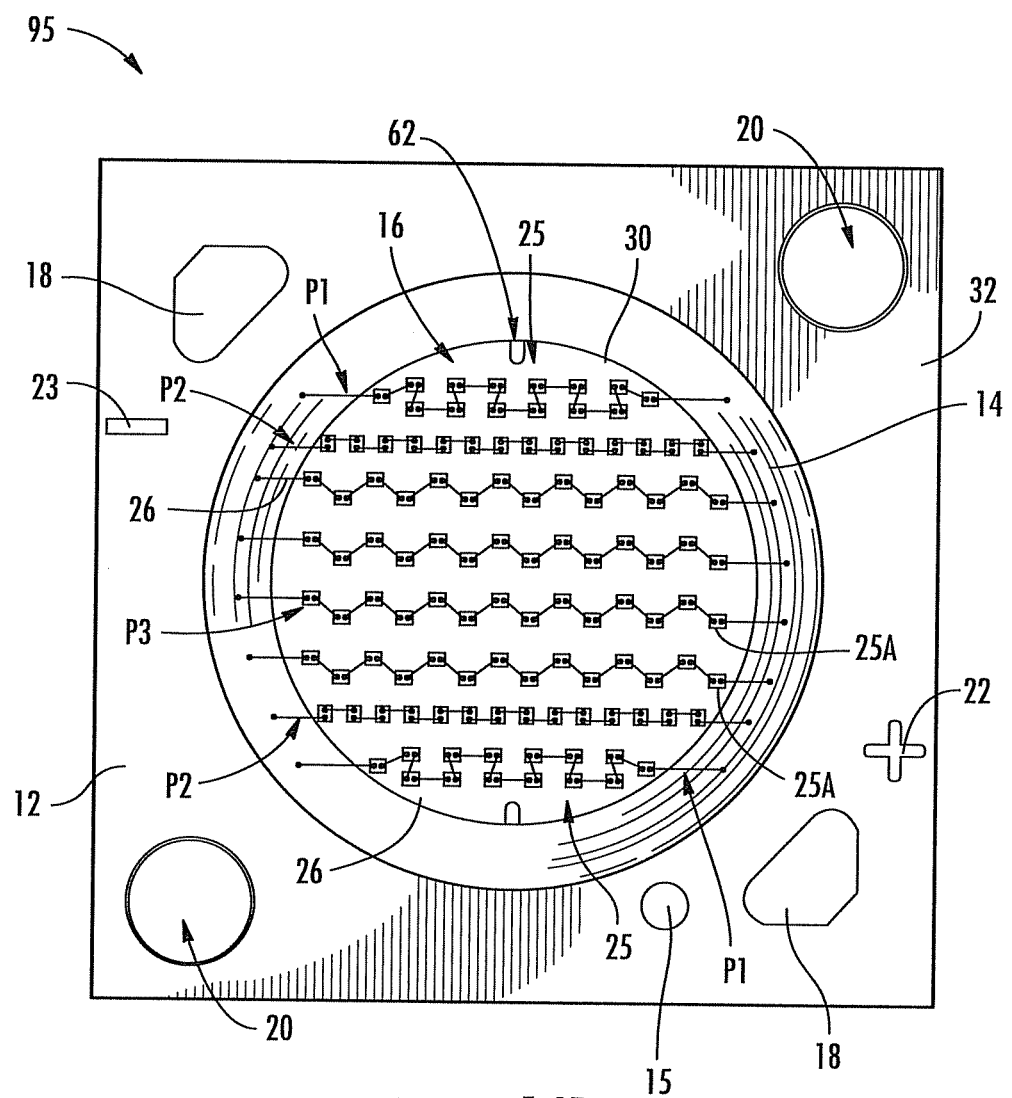

FIGS. 14A and 14B illustrate further embodiments of LED devices. In one aspect, the LED devices in FIGS. 14A and 14B comprise eight strings of 14 LEDs 25. Referring to FIG. 14A, an LED device generally designated 90 is illustrated, and can be operable at higher voltages, not limited to greater than or equal to approximately 42 V. LED device 90 can comprise one or more strings of LEDs 25 arranged in one or more patterns across emission area 16 and/or conductive pad 30. In one aspect, LED device 90 can comprise eight strings of LEDs 25 arranged in more than one pattern. Each string of LEDs 25 can comprise 14 LEDs 25, or 112 total LEDs. In one aspect, the first and last strings can comprise previously described pattern P2. The second through seventh strings of LEDs 25 can comprise previously described pattern P3. Notably, LED devices illustrated by FIGS. 11 to 14B can comprise a uniform optical source in the form of single, cohesive, and undivided emission area which can simplify the manufacturing process for manufacturers of light products requiring a single component.

FIG. 14B illustrates another embodiment of an eight string LED device, generally designated 95. Like LED device 90, LED device 95 can comprise eight strings of 14 LEDs 25. Spacing between adjacent LEDs 25 within the same string and adjacent LEDs 25 within different strings has been maximized to minimize the amount of light absorbed by adjacent LEDs. In one aspect, LED device 95 can comprise previously illustrated first pattern P1 (FIG. 3A) as the first and last strings. The second and seventh strings can comprise pattern P2, and the third through sixth strings can comprise pattern P3. Notably, LEDs 25 of patterns P1, P2, and P3 extend at least substantially the full length and width of conductive pad 30. LEDs 25 of P1, P2, and P3 can be spaced further apart horizontally and/or vertically such that an amount of light blocked by adjacent LEDs 25 can be decreased. In one aspect, pattern P1 spacing has been increased at least approximately 41%, or by 225 μm, or greater in the horizontal direction and by at least approximately 27%, or by 210 μm, or greater in the vertical direction from P1 in LED device 10 to P1 in LED device 95. Similarly, horizontal and/or vertical spacing between LEDs 25 in pattern P2 can be increased at least approximately 4% or greater over P2 in LED device 90. Intra-string spacing i.e., spacing between LEDs 25 of adjacent strings can be increased by at least approximately 68%, or by 750 μm, or greater in LED device 95. Notably, although LED device 95 can comprise the same number of LEDs 25 as LED device 90, e.g., 112 LEDs, LED device 95 can have at least an approximate 1% to 2%, or greater, increase in efficiency and brightness when compared to LED device 90.

In one aspect, LED devices 10, 60, 70, 80, and 90 disclosed by FIGS. 3A, 3B, and 11 to 14B can comprise a large quantity of LEDs 25 arranged in one or more patterns over conductive pad 30. In one aspect, LED devices disclosed herein comprise a quantity of more than 64 LEDs 25. For example, in one aspect and without limitation, LED device 10 can comprise 140 total LEDs, or 10 strings of LEDs 25 electrically connected in series. LED device 60 can comprise 150 total LEDs, or 30 strings of five LEDs 25 electrically connected in series. LED device 70 can comprise 70 total LEDs, or five strings of 14 LEDs 25. LED device 80 can comprise 84 total LEDs, or six strings of 14 LEDs 25. LED device 90 can comprise 112 total LEDs, or eight strings of 14 LEDs 25. LEDs 25 used in LED devices described herein can comprise a small footprint, or surface area when compared to conductive pad 30. For example and without limitation, LEDs 25 can comprise chips of the following dimensions in Table 1 below:

TABLE 1

|  | Length (μm) | Width (μm) |
|---|---|---|
| LED chip size | 350 | 470 |
|  | 230 | 660 |
|  | 500 | 500 |
|  | 520 | 700 |

In one aspect and without limitation, conductive pad 30 can comprise a radius of approximately 6.568 mm and an area of approximately 135.5 mm$^2$. Thus, the ratio of the area of a single LED chip 25 and the area of conductive pad 30 can comprise approximately 0.0027 or less. In one aspect, the ratio of the area of a single LED chip 25 and the area of conductive pad 30 can comprise approximately 0.0018 or less. In other aspects, the ratio can comprise approximately 0.0012 or less. Table 2 below lists various LED 25 chip sizes and the area of conductive pad 30. LEDs 25 can comprise chips that are small compared to the area of conductive pad, that is, approximately 0.0027 of the area of the conductive pad or less. Any chip size can be used however.

TABLE 2

| Chip Size (μm) | Conductive Pad Area (mm$^2$) | Ratio of Chip Area to Conductive Pad Area |
|---|---|---|
| 350 × 470 | 135.5 | 0.0012 |
| 230 × 660 | 135.5 | 0.0011 |
| 500 × 500 | 135.5 | 0.0018 |
| 520 × 700 | 135.5 | 0.0027 |

Using a large quantity of LEDs 25 comprising a smaller footprint over a single emission area can advantageously allow for more uniform light output in addition to desirable optical properties such as high brightness as the LEDs 25 can be arranged into one or more uniform patterns over a portion of emission area 16. The concentrated patterns of LEDs 25 can allow for concentrated light emission. In one aspect, the density or spacing of LEDs 25 in the one or more patterns described herein can be adjusted such that light will not be absorbed or blocked by adjacent LEDs 25. That is, patterns and arrangements of LEDs 25 disclosed herein may improve light extraction by minimizing the amount of light absorbed by adjacent or neighboring LEDs 25. The number of LEDs 25 per string can allow LED devices to be operable at low to high voltages. For illustration purposes, four patterns have been illustrated. However, any suitable pattern of LEDs 25 is contemplated. Each string of LEDs 25 can comprise a single pattern or a combination of more than one pattern.

Figure 15A:
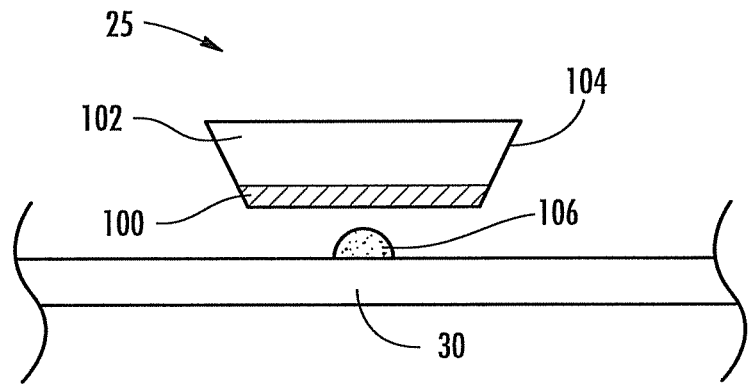
FIGS. 15A and 15B are views of die attach techniques used for LED devices according to the disclosure herein.
Figure 15B:
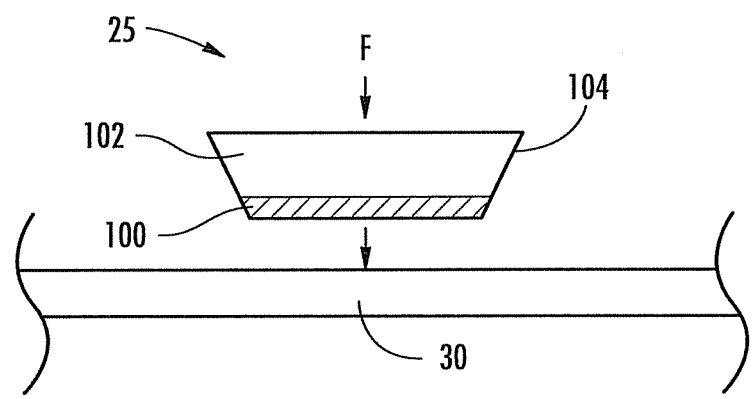

FIGS. 15A and 15B illustrate methods of die attach that can, for example and without limitation, be used for LED devices according to the disclosure herein. LED 25 can comprise a backside metal pad or bonding layer 100 for mounting over conductive pad 30. Bonding layer 100 can comprise a length of the entire bottom surface LED 25 or a portion thereof. For illustration purposes, bonding layer 100 is illustrated as having a same length as the entire bottom surface of LED 25, however, any configuration is contemplated. LED 25 can comprise lateral sides 104 which can extend between an upper surface and the bottom surface of LED 25. FIGS. 15A and 15B illustrate inclined lateral sides 104, however, lateral sides 104 can be substantially vertical or straight where a straight-cut LED is selected. FIGS. 15A and 15B illustrate LEDs 25 having an upper surface of a greater surface area than an area of bottom surface comprising bonding layer 100. However, upper surface can be of a smaller surface area than the surface area of bonding surface. LEDs 25 can comprise a square, rectangle, or any suitable shape in addition to having any suitable lateral side configuration.

Any suitable die attach method can be used to mount LED 25 over conductive pad 30 in any of the LED devices previously described. In one aspect, any suitable optimized die attach method and/or materials can be used. For example, optimized die attach methods can comprise metal-to-metal die attach methods for facilitating attachment of one or more metals on and/or between LED 25 and conductive pad 30. FIG. 15A illustrates an example of a metal-to-metal die attach method which can be eutectic or non-eutectic. This metal-to-metal die attach method can comprise using an assist material 106 to facilitate the metal-to-metal die attach. In one aspect, a flux-assisted eutectic metal-to-metal die attach method can be used and in other aspects a metal-assisted non-eutectic metal-to-metal die attach method can be used. In a flux-assisted eutectic, or flux eutectic, die attach method, bonding layer 100 can comprise a metal alloy having a eutectic temperature, for example, but not limited to, an alloy of gold (Au) and tin (Sn). For example, bonding layer 100 can comprise an 80/20 Au/Sn alloy having a eutectic temperature of approximately 280° C. In the flux eutectic technique, assist material 106 can comprise a flux material. In the non-eutectic technique, assist material 106 can comprise a metallic material as well as an adhesive such as silicone or epoxy. The assist material 106 can comprise a conduit for facilitating the metal-to-metal die attach between the bonding layer 100 and conductive pad 30 when the bonding layer 100 is heated above the eutectic temperature. The metal of bonding layer 100 can flow into and attach to the metal of conductive pad 30. The metal of bonding layer 100 or can atomically diffuse and bond with atoms of the underlying mounting conductive pad 30. In one aspect, flux used in a flux-assisted eutectic method can comprise a composition, for example, 55-65% rosin and 25-35% polyglycol ether in addition to small amounts of other components. Any suitable flux material can be used however.

Flux-assisted eutectic die attach methods can be tedious, and it is unexpected to use such methods when attaching a large quantity of LEDs 25 in predetermined arrangements and/or an array. Flux eutectic die attach according to the present subject matter can comprise dispensing flux assist material 106, that can be liquid at room temperature, in an amount to be precisely the right volume to avoid either floating of the LEDs 25 or poor die attach if too much or too little flux is used. Flux-assisted eutectic die attach according to the present subject matter can also require the right composition for each of the flux assist material 106 and bonding metal 100 of the emitter chips. Flux-assisted eutectic die attach according to the present subject matter can optimally utilize a very clean and flat surface and substrates or submounts that do not move or bend during heating and cooling such to stress the solder joint. Flux-assisted eutectic according to the present subject matter can utilize a fine surface roughness that is small enough not to encumber the Au/Sn bonding surface of the emitter chips while being rough enough to allow flux to escape during heating. The heating profile can be matched perfectly to the bonding metal 100, such as Au or AuSn, to ensure a good weld between the bonding metal 100 and underlying conductive pad 30. Using flux-assisted eutectic for die attach according to the present subject matter also can utilize an inert atmosphere, such as a nitrogen atmosphere, to reduce oxygen gas ($O_2$) levels and also allow gravity to apply a downward force on LEDs 25. This can reduce the amount of oxidation at the metal-to-metal bond between bonding layer 100 and underlying conductive pad 30.

Still referring to FIG. 15A, a non-eutectic metal-to-metal die attach method can be used which can also comprise an assist material 106, wherein the assist material 106 can comprise a metallic material. In this aspect, bonding layer 100 can comprise a single metal or a metal alloy. For example, bonding layer 100 can comprise Au, Sn, or AuSn. In non-eutectic methods, the bonding layer does not need to reach or exceed a temperature, for example, a eutectic temperature. In this aspect, assist material 106 can comprise a metallic, silicone, or epoxy material to facilitate the metal-to-metal bonding. For example, assist material 106 can comprise AuSn paste, silicone adhesive, or Ag epoxy. Any suitable adhesive or assist material 106 can be used. The metal of bonding layer 100 can attach to the adhesive or metal of the assist material 106, where the assist material is metal. The metal of the assist material 106 can also attach to the metal of conductive pad 30. In one aspect, a metal "sandwich" forms between bonding layer 100, assist material 106, and conductive pad 30 in non-eutectic metal-to-metal attach techniques where a metallic assist material 106 is used. Metal-assisted, non-eutectic die attach can be tedious, just as flux-assisted methods, and it is also unexpected to use such methods when attaching LEDs 25 within one or more patterns for LED devices described herein. Metal-to-metal attachment using an assist material 106 can be hard to control and tedious when attaching multiple small footprint LEDs within a device.

FIG. 15B illustrates a metal-to-metal die attach technique which does not require an assist material 106. One such method can comprise a thermal compression die attach method wherein the metal of bonding layer 100 will directly attach to the metal of conductive pad 30. The thermal compression method can be eutectic or non-eutectic. In one aspect, thermal compression can be used when bonding layer 100 comprises an alloy having a eutectic temperature. In other aspects, bonding layer 100 can comprise a metal not having a eutectic temperature. Conductive pad 30 can comprise any suitable metal, not limited to a Cu, Al, Ag, or Pt layer within a metal core printed circuit board (MCPCB). Bonding layer 100 comprises any suitable metal. In one aspect, bonding layer 100 can comprise a layer of Sn having any suitable thickness. In one aspect, bonding layer 100 can comprise a thickness greater than approximately 0 μm. In one aspect, bonding layer 100 can comprise a bonding layer equal to or greater than at least approximately 0.5 μm. In one aspect, bonding layer 100 can comprise a layer of Sn having a thickness of at least equal to or greater than approximately 2.0 μm. Unlike the flux-assisted eutectic or metal-assisted non-eutectic methods just described, thermal compression metal-to-metal die attach techniques can utilize an external downward force F as illustrated in FIG. 15B.

Force F can comprise a compression delivered in a heated environment, thus deemed a thermal compression, as opposed to dispensing a flux or metallic assist material 106. The thermal compression technique is an alternative die attach method developed to reduce metal squeeze out along the conductive pad 30 which can form Shottky or shunt defects and allow subsequent leakage of current and other various and related problems. In one aspect, the bonding temperature in thermal compression techniques can be approximately 255-265° C. after optionally subjecting conductive pad 30 to a pre-heat treatment or process. Conductive pad 30 can be heated to a mounting temperature of at least 20° C. above the melting temperature of the bonding layer 100. The bonding time can be approximately 300 msec and the bonding force can be approximately 50+/−10 grams (g). Predetermined settings can be important for this method, including adequate preheat, bonding temperature, bonding time, and bonding force. The equipment and predetermined settings for use with thermal compression methods can be difficult to use and/or maintain, and it is unexpected to use such methods when attaching a large quantity of LEDs 25 in an array and/or one or more patterns. Metal-to-metal methods for attaching an array of LEDs in LED devices is not known and is unexpected to use flux-assisted eutectic, metal-assisted non-eutectic, or thermal compression die attach techniques for attaching one or more strings of LEDs 25 in an array or pattern arrangement.

Figure 16:
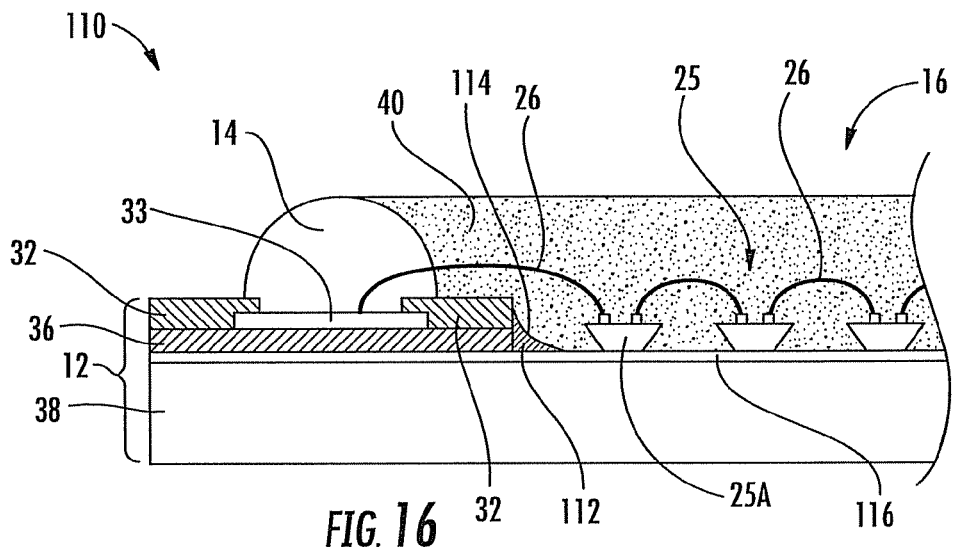
FIGS. 16 to 18 are cross-sectional views of light emitting devices according to the disclosure herein.

FIG. 16 is a cross-sectional view of a portion of a light emitting device, or LED device, generally designated 110. LED device 110 can be similar in form and function to any of the devices previously described herein (e.g., 10, 50, 55, 60, 70, 80, 85, 90, and 95). In one aspect, LED device 110 comprises a submount 12 over which a retention material 14 and a light emission area 16 can each be disposed. In one aspect, retention material 14 can be dispensed about light emission area to dam, enclose, or support filling material 40 disposed within emission area 16. For example, emission area 16 can comprise one or more LEDs 25 disposed under filling material 40. The LEDs 25 can electrically and/or thermally communicate with one or more layers of submount 12. In one aspect, a plurality of LEDs 25 can be disposed over submount 12. The plurality of LEDs 25 can be electrically connected in series, parallel, combinations thereof, and can also be arranged in one or more patterns or arrays as previously described. Emission area 16 can further comprise a fillet member or fillet 112 at least partially disposed about the LEDs 25 and along one or more edges of emission area 16. The term "fillet" can be broadly defined as a strip or band of material which can be any size (e.g., any width and/or thickness) and can comprise any straight, concave, and/or convex surfaces for placement between one or more portions of device 110. In one aspect, the fillet 112 can comprise a narrow or thin band of material placed between one or more portions of device 110 thereby bridging the one or more portions of device 110.

Figure 17:
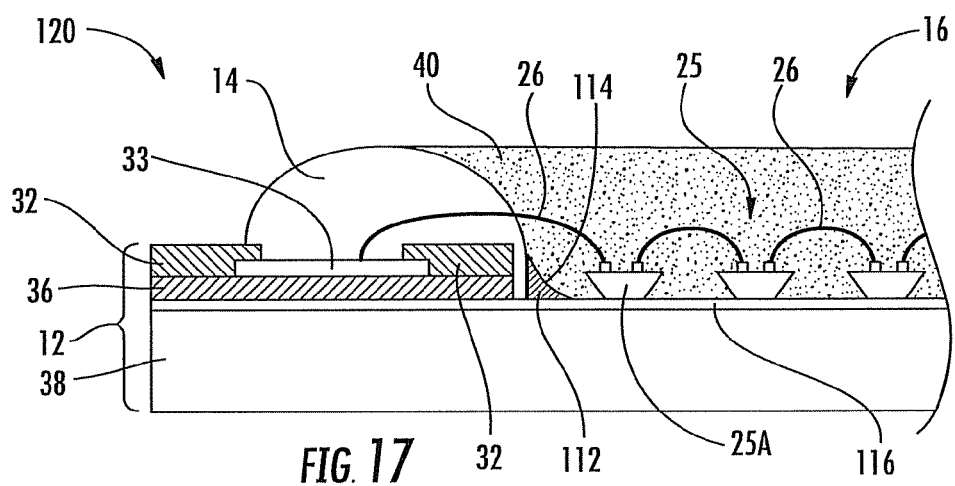
Figure 18:
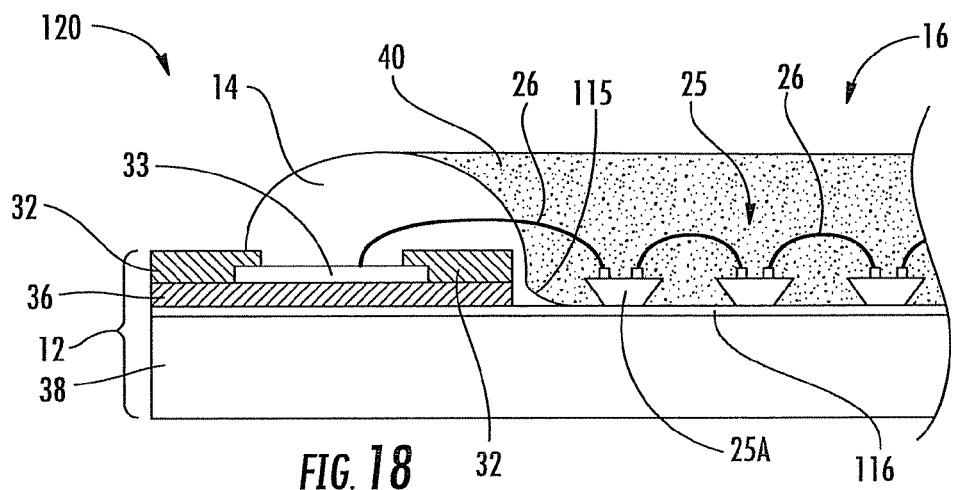

One or more portions of fillet 112 can be at least partially covered by filling material 40. Fillet 112 can, for example and without limitation, be arranged along an edge of emission area 16 that is disposed inboard and spaced apart from retention material 14 (FIG. 16) or inboard and directly adjacent retention material 14 (FIG. 17). That is, fillet 112 can be disposed between a portion of one or more LEDs 25 and portions of retention material 14 and between a portion of the one or more LEDs 25 and the outermost edge of device 110. Fillet 112 can be disposed directly adjacent one or more portions of one or more layers of submount 12 (e.g., solder mask 32 layer, dielectric layer 36, or core layer 38 as shown in FIG. 16). In other aspects, retention material 14 can be formed such that it forms and comprises an integral outer edge portion 115 that can be an extension of retention material 14 and shaped like a fillet (FIG. 18). Fillet 112 can also be disposed between outermost LEDs 25 and portions of conductive trace 33, portions of solder mask 32, and/or portions of dielectric layer 36. Notably, fillet 112 can comprise a clear or reflective material for increasing the reflectivity of light, thereby increasing brightness of LED device 110. Fillet 112 can also advantageously reduce and/or eliminate defects that occur during introduction of filling material 40. In one aspect, defects such as bubbles can occur during application (e.g., dispensing) of filling material 40. Such defects can block and/or interfere with light emitted from the LEDs 25. Fillet 112, therefore, advantageously reduces and/or eliminates defects occurring during encapsulation thereby improving the performance of device 110. In one aspect, fillet 112 can advantageously allow for a more uniform encapsulant or filling material 40 as a result of fewer defects.

As previously described, filling material 40 can comprise an encapsulant having a predetermined, or selective, amount of phosphors and/or lumiphors in an amount suitable for any desired light emission, for example, suitable for white light conversion. Filling material 40 can interact with light emitted from the plurality of LEDs 25 such that a perceived white light, or any suitable and/or desirable wavelength of light, can be observed. Any suitable combination of encapsulant and/or phosphors can be used, and combinations of different phosphors for resulting in desired light emission or color points can be used. Filling material 40 can be filled to any level within emission area 16, for example, a level that is substantially flush with a top surface of retention material 14 (as illustrated) or to any level above and/or below the top surface of retention material 14.

In one embodiment, bubbles, or other defects, can occur during encapsulation (e.g., application of filling material 40) at sharp, cornered edges of devices due to improper filling. For example, bubbles can occur along one or more sharp edges of substrate 12 or other mounting surfaces (e.g., conductive pad 30, FIG. 7) within emission area 16 as the substantially viscous encapsulant or filling material 40 can improperly fill such areas. Bubbles or other light affecting defects can form and float up as filling material 40 disperses or moves into areas with sharp corners. Bubble defects can block and/or improperly deflect light thereby hindering brightness and other optical properties of such LED devices. Notably, introduction of fillet 112 can effectively seal and/or substantially reduce the height of sharp corners or edges within emission area 16 thereby improving flow of filling material 40 to such areas. This can eliminate and/or substantially reduce the occurrence of bubbles. As such, fillet 112 can advantageously increase brightness and/or performance of device 110 by reducing defects occurring during encapsulation.

Fillet 112 can also increase brightness and/or performance of device 110 by adding another surface from which light can be reflected. In one aspect, fillet 112 can comprise a substantially curved or concave upper surface 114 for improving flow of filling material 40 during encapsulation. Fillet 112 can also in one aspect comprise a substantially triangular shaped cross-section with orthogonal sides formed adjacent curved upper surface 114 such that at least a portion of the cross-section forms a right-angle for effectively filling, or sealing, sharp corners within emission area 16, as shown for example in FIG. 16. In one aspect, any bubbles that may occur in fillet 112 can pop or burst because the volume of fillet 112 is small. The fillet 112 can be cured, or partially cured, before encapsulation (e.g., before dispensing filling material 40). As such, bubbles cannot form in the encapsulant 40 with the fillet 112 in place. In one aspect, fillet 112 can comprise the same material as filling material 40 and/or retention material 14. In some aspects, fillet 112 can be dispensed simultaneously at the same time and at the same processing step at which retention material 14 can be dispensed or formed.

Still referring to FIG. 16, LED device 110 or devices and methods in accordance with the disclosure herein can comprise providing submount 12 and providing LEDs 25 over submount 12 and electrically connected in series or parallel via wirebonds 26. Wirebonds 26 can supply electrical current from electrically conductive traces 33 and 34. Providing LED device 110 can comprise dispensing retention material 14 at least partially about the one or more LEDs 25 and over the submount 12 and in any desired shape (e.g., such that emission area 16 and retention material 14 comprise any regular, irregular, or asymmetrical shape). Retention material 14 can be dispensed over, and thereby cover at least a portion of one or more wirebonds 26. After dispensing retention material 14 and prior to filling emission area 16 with filling material 40, the clear or reflective fillet 112 can be dispensed and optionally cured to prevent bubbles from forming during encapsulation. In one aspect, fillet 112 can comprise a clear silicone material. In other aspects, fillet 112 can comprise the same encapsulant material used for filling material 40 and/or retention material 14. In further aspects, fillet 112 can comprise a clear silicone material having a reflective material added thereto.

For example and without limitation, fillet 112 can comprise silicone and any additional reflective material or reflective particulate material such as titanium dioxide ($TiO_2$) particles or aluminum oxide ($Al_2O_3$) particles. Fillet 12 can comprise the same material as retention material 14 and can optionally be simultaneously formed (e.g., dispensed) with retention material 14 in a same processing step. LED device 110 can be encapsulated with a silicone encapsulant (e.g., filling material 40) typically containing phosphor after dispensing and optionally curing fillet 112. Fillet 112 can further improve wetting to dissimilar or otherwise incompatible materials and can improve adhesion within the portions of submount 12. For example, where submount 12 comprises an FR-4 dielectric material, an adhesive material can be used to laminate portions of dielectric layer 36 to core layer 38. As known in the art, such adhesive materials can contain an epoxy which may have residual amine groups which can poison some Pt-cured silicone materials typically used for encapsulation. Notably, fillet 112 can therefore provide a barrier as well as an intermediate layer which is compatible to both epoxy and silicone materials which can improve adhesion within the submount 12 and which can prevent poisoning of Pt-cured silicone materials used for encapsulation (e.g., a Pt-cured silicone filling material 40).

As noted above, submount 12 can, for example and without limitation, comprise an FR-4 dielectric laminate panel which can differ slightly from that of previously described devices (e.g., FIG. 7), as the dielectric material can be less than fully disposed over the base layer, and as the dielectric material can comprise a FR-4 laminate panel which can be different from layers of the previously described MCPCB. For example, submount 12 can comprise a base or core layer 38, a dielectric layer 36, at least one conductive trace 33, and one or more layers of solder mask 32. Submount 12 can also comprise a bonding layer (not shown) such as epoxy which can be disposed between portions of dielectric layer 36 and core layer 38 and/or portions of core layer 38 and one or more reflection layers 116. A second conductive trace (e.g., 34) can be disposed on the opposite side of LED device 110, and is not shown (e.g., see location of 34 in FIG. 7). Core layer 38 can comprise a base metal material, for example and not limited to, an Al or Al-alloy material. In one aspect, core layer 38 can comprise Al or Al-alloy that can be approximately 0.5 millimeters (mm) to 1.6 mm thick. Any sub-range of thickness between 0.5 mm and 1.6 mm is contemplated, for example, approximately 0.5-0.8 mm; 0.8-1.2 mm; or 1.2-1.6 mm of Al or Al-alloy can be used. Thicknesses less than approximately 0.5 mm and greater than approximately 1.6 mm can also be used and are also contemplated. A mounting surface, such as one or more thin, reflection enhancement layers 116 can be applied to the top surface of core layer 38 to improve light output.

One or more reflection enhancement layer(s) 116 can be formed integral as one piece of submount 12 or can comprise one or more separate layer(s) disposed over portions of core layer 38 of submount 12. In one aspect, the reflection enhancement layer(s) 116 can be at least partially disposed below one or more portions of dielectric layer 36. LEDs 25 can attach to and/or be mounted to reflection enhancement layer(s) 116 using any attachment material or method known in art as previously described herein. In one aspect, LEDs 25 can attach to enhancement layer(s) 116 using adhesive, solder paste, epoxy, flux, and combinations thereof. In one aspect, reflection enhancement layer(s) 116 can be optimized for the silicone interface (e.g., the interface between layers 116 and fillet 112 and layer(s) 116 and filling material 40). In other aspects, reflection enhancement layer(s) 116 can comprise one or more transparent or reflective dielectric layers disposed below LEDs 25 for improving reflectivity, thereby improving brightness. In one aspect, reflection enhancement layer(s) 116 can comprise more than one layer, for example, one or more metal layers adhered to and/or between one or more dielectric enhancement layers via binding materials as known in the art. In one aspect, reflection enhancement layer (s) 116 can have a total thickness of approximately 30 nanometers (nm), however, sub-ranges of thicknesses comprising approximately 1-10 nm; 10-20 nm; 20-30 nm; 30-40 nm; 40-50 nm; and greater than approximately 50 nm are also contemplated herein.

Dielectric layer 36 can comprise a layer of FR-4 dielectric laminate material, portions of which can be attached or applied to core layer 38 and/or reflection enhancement layer (s) 116 via adhesive (e.g., epoxy). In one aspect, dielectric layer 36 comprises an FR-4 laminate that is approximately 100 µm thick. Other ranges or sub-ranges of thicknesses can be used however, such as 0-50 µm; 50-100 µm; 100-150 µm; or greater than approximately 150 µm. Any thickness of dielectric layer 36 (e.g., laminate panel) is hereby contemplated. Notably, dielectric layer 36 does not extend over entire core layer 38 as illustrated in FIG. 7, but rather, adheres to areas outside of the outermost LEDs 25A.

Substrate 12 can further comprise one or more electrical elements such as conductive trace 33 (and even an opposing conductive trace). Conductive trace 33 can comprise a layer of Cu or Cu-alloy and can be attached or disposed over dielectric layer 36 via using an adhesive, plating, or any other suitable attachment technique known in the art for connecting Cu trace 33 to dielectric layer 36. For example, FR-4 laminates typically comprise a layer of Cu foil that can be etched according to standard PCB processes. In one aspect, the thickness of conductive trace 33 can be approximately 35 µm (e.g., approximately 1 ounce (oz.)). However, conductive trace 33 can be thicker and/or thinner than approximately 35 µm, for example, and can be any sub-range of thicknesses such as approximately 0-35 µm; 35-55 µm; 55-75 µm; or any thickness greater than approximately 75 µm. Any thickness of Cu components such as conductive traces 33, 34 is hereby contemplated.

In one aspect, conductive trace 33 can be plated with a wirebondable metal or wirebondable metals such as electroless nickel and immersion gold metals (i.e., ENIG) or electroless nickel, electroless palladium, immersion gold metals (i.e., ENEPIG) to improve the bonding or adhesion between wirebonds 26 and trace 33. In other aspects, conductive trace 33 can be used alone without any further plating or coating. In further aspects, conductive trace 33 can be plated or coated with any other metal or material for improving wirebondability, or adhesion between wirebonds 26 and trace 33. Substrate 12 can further comprise one or more layers of solder mask 32 disposed over conductive trace 33 such that portions of solder mask 32 adhere directly to portions of conductive trace 33 (i.e., plated or non-plated) and/or directly to portions of dielectric layer 36. At least one portion of conductive trace 33 can be left uncoated by solder mask 32 such that it is open and exposed for bonding or electrically connecting to one or more wirebonds 26. Uncovered portions of conductive trace 33 can later become at least partially covered with a portion of retention material 14 as shown. Solder mask 32 can comprise any suitable electrically insulating material. In one aspect, a white solder mask 32 may be preferred for improving the reflectivity of the device.

FIGS. 17 and 18 are cross-sectional views of a portion of a light emitting device, or LED device, generally designated 120. LED device 120 is also similar in form and function to any of the previously described devices, for example, device 120 can be similar to device 110 with the exception of the placement and/or shape of retention material 14. For example, FIGS. 17 and 18 illustrate a device 120 wherein retention material 14 can be moved and/or expanded such that it at least partially covers reflection enhancement layer(s) 116. In further aspects, retention material 14 can comprise an outer edge portion 115 having a curved or concave upper surface which is shaped similar to fillet 112 described herein (FIG. 18).

Referring to FIGS. 17 and 18, LED device 120 can comprise an emission area 16 having one or more LEDs 25 disposed over a FR-4 dielectric laminate panel substrate 12 as shown and described in FIG. 16. The LEDs 25 can be at least partially covered by filling material 40 and surrounded by retention material 14. As FIGS. 17 and 18 illustrate, retention material 14 can be moved during dispensing and/or comprise an expanded width such that retention material 14 moves closer to outermost LEDs 25A and is disposed over at least a portion of reflection enhancement layer(s) 116. For example, in one aspect retention material 14 can be dispensed entirely over the portion of solder mask 32 that is adjacent emission area 16. Moving retention material 14 at least partially into emission area 16 (e.g., at least partially over mounting surface, layer(s) 116) can allow any bubbles or defects that may potentially form to become disposed adjacent the dam or retention material 14. This would not likely result in a visible defect, and therefore would not likely hinder overall brightness or optical properties of device 120. That is, dispensing retention material 14 at least partially over the mounting surface (e.g., layer(s) 116) of emission area 16 and can advantageously reduce and/or minimize light affecting defects by reducing formation of such defects and/or by providing a surface to which such defects (e.g., bubbles) can adhere to, thereby decreasing the amount of light that becomes deflected or blocked.

Fillet 112 can be used with the moved or widened retention material 14 as illustrated in FIG. 17, or the moved/widened retention material 14 could be used alone without need for a fillet 112 as illustrated in FIG. 18. For example, as FIG. 17 illustrates, fillet 112 can be provided directly adjacent retention material 14 via dispensing or otherwise positioning fillet 112 within emission area 16. As described earlier, fillet 112 can comprise a substantially curved or concave upper surface 114 for improving flow of filling material 40 during encapsulation. As such, fillet 112 can advantageously increase brightness of device 110 by reducing defects occurring during encapsulation. Fillet 112 can also increase brightness of device 110 by adding another surface from which light can be reflected. As FIG. 18 illustrates, retention material 14 can comprise an outer edge portion 115 shaped substantially similar to fillet 112. That is, outer edge portion 115 can comprise a substantially triangular shaped cross-section with orthogonal sides formed adjacent a curved upper surface such that at least a portion of the cross-section of portion 115 forms a right-angle for effectively filling, or sealing, sharp corners within emission area 16. Thus, retention material 14 can advantageously increase brightness of device 120 by reducing defects occurring during encapsulation and can also increase brightness of device 110 by adding another surface or portion 115 from which light can be reflected.

Figure 19:
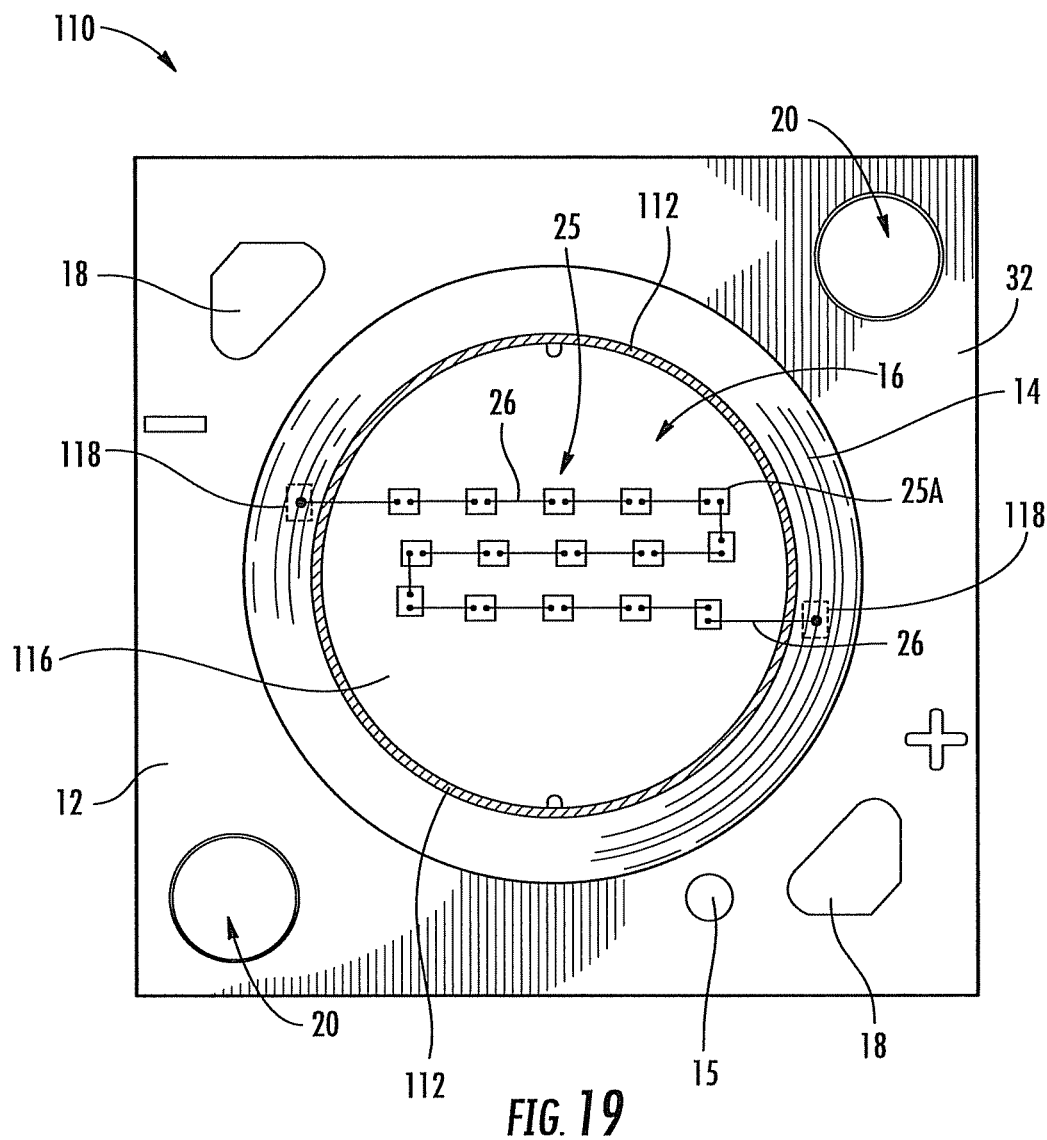
FIG. 19 is a top view of a light emitting device according to the disclosure herein.

FIG. 19 illustrates a top view of LED device 110 prior to application of filling material 40. FIG. 19 illustrates fillet 112 disposed inboard of retention material 14 and disposed all the way around or about the perimeter of emission area 16 and LEDs 25. Fillet 112 can also be disposed and extend only partially around or about the perimeter of emission area 16 and LEDs 25, and fillet 112 can be disposed in a continuous manner or can comprise a plurality of discontinuous sections. Emission area 16 can comprise a single, uniform area with a plurality of LEDs 25 wirebonded in series over reflection enhancement layer(s) 116. In one aspect, LED device 110 can comprise a single string of LEDs 25 electrically connected in series over substrate 12, where the string can comprise more than one row of LEDs 25 and can extend across a larger portion of substrate 12 than previously illustrated devices having strings extending across the emission area 16 in a single row. Notably, the string of LEDs 25 can connect to smaller openings or exposed portions 118 of conductive traces 33 and 34. Exposed portions 118 are illustrated in broken lines as such portions can be disposed below retention material 14. Exposed portions can be created by opening up (e.g., via etching or otherwise) and/or patterning (e.g., via depositing a photoresist layer or otherwise) isolated areas of solder mask 32 such that it will not cover one or more predefined areas of conductive trace(s). Creating one or more isolated areas of exposed portions 118 of conductive traces, such as conductive traces 33 and 34, as opposed to multiple or large openings (e.g., FIGS. 8, 10) can advantageously create a brighter LED device by reducing light interaction with the FR-4 like dielectric laminate material.

Embodiments of the present disclosure shown in the drawings and described above are exemplary of numerous embodiments that can be made within the scope of the appended claims. It is contemplated that the configurations of LED devices and methods of making the same can comprise numerous configurations other than those specifically disclosed.

What is claimed is:
1. A light emitting device, comprising:
a submount comprising a planar surface;
a light emission area disposed over the submount, wherein the light emission area comprises at least one light emitting diode (LED); and
a fillet at least partially disposed about the light emission area, wherein the fillet and the at least one LED are each disposed along the planar surface of the submount.
2. The light emitting device of claim 1, wherein the fillet is clear or reflective.
3. The light emitting device of claim 2, wherein the fillet comprises silicone.
4. The light emitting device of claim 3, wherein the silicone fillet further comprises reflective particulate material such as titanium dioxide ($TiO_2$) or aluminum oxide ($Al_2O_3$).

5. The light emitting device of claim 1, further comprising filling material, wherein the filling material is disposed over a portion of the light emission area and a portion of the fillet.

6. The light emitting device of claim 5, wherein the filling material comprises a silicone encapsulant containing phosphor.

7. The light emitting device of claim 1, wherein the light emission area comprises at least one string of light emitting diodes (LEDs).

8. The light emitting device of claim 1, wherein the light emission area comprises an array of light emitting diodes (LEDs).

9. The light emitting device of claim 8, wherein the light emission area comprises a plurality of LEDs electrically connected in series.

10. The light emitting device of claim 9, comprising a plurality of strings of LEDs electrically connected in series.

11. The light emitting device of claim 10, wherein electrical ends of the plurality of strings of LEDs are electrically connected to areas of electrically conductive traces.

12. The light emitting device of claim 1, wherein the submount comprises a base material and a dielectric laminate disposed over a portion of the base material.

13. The light emitting device of claim 12, wherein the base material comprises aluminum (Al) or an Al-alloy.

14. The light emitting device of claim 13, wherein the Al or Al-alloy has a thickness of approximately 0.5 millimeters (mm) to 1.6 mm.

15. The light emitting device of claim 12, wherein the submount further comprises a copper (Cu) trace disposed over the dielectric laminate.

16. The light emitting device of claim 15, wherein the submount further comprises a layer of solder mask at least partially disposed over the Cu trace.

17. The light emitting device of claim 12, wherein the submount further comprises at least one reflection enhancement layer disposed between portions of the base material and portions of the light emission area.

18. The light emitting device of claim 17, further comprising a retention material at least partially disposed around the light emission area.

19. The light emitting device of claim 18, wherein the retention material is disposed over a portion of the reflection enhancement layer.

20. The light emitting device of claim 17, wherein the reflection enhancement layer comprises one or more transparent or reflective dielectric layers.

21. The light emitting device of claim 1, wherein the fillet comprises a curved upper surface for reducing defects during encapsulation.

22. The light emitting device of claim 1, further comprising a retention material at least partially disposed around the light emission area.

23. The light emitting device of claim 22, wherein the fillet is disposed in an area between the light emission area and a portion of the retention material.

24. The light emitting device of claim 1, wherein the fillet is disposed in an area between the light emission area and a portion of a conductive trace.

25. A light emitting device, comprising:
a submount comprising a planar mounting surface;
one or more light emitting diodes (LEDs) disposed over the submount;
a fillet disposed over a portion of the submount; and
a filling material disposed over a portion of the one or more LEDs and a portion of the fillet
wherein a portion of the fillet is disposed adjacent a portion of the LED along the planar mounting surface of the submount.

26. The light emitting device of claim 25, further comprising a retention material at least partially disposed about the one or more LEDs.

27. The light emitting device of claim 26, wherein the fillet is at least partially disposed between a portion of the retention material and the one or more LEDs.

28. The light emitting device of claim 26, wherein the fillet and retention material are comprised of the same material.

29. The light emitting device of claim 25, wherein the fillet and the filling material are comprised of the same material.

30. The light emitting device of claim 29, wherein the material comprises silicone.

31. The light emitting device of claim 25, wherein the fillet comprises a curved upper surface for reducing defects during encapsulation.

32. The light emitting device of claim 25, wherein the fillet is clear or reflective.

33. The light emitting device of claim 25, wherein the submount comprises a dielectric laminate disposed over a portion of a base material.

34. The light emitting device of claim 33, wherein the base material comprises aluminum (Al) or an Al-alloy.

35. The light emitting device of claim 34, wherein the Al or Al-alloy has a thickness of approximately 0.5 millimeters (mm) to 1.6 mm.

36. The light emitting device of claim 25, wherein the one or more LEDs comprise a plurality of LEDs electrically connected in series.

37. The light emitting device of claim 36, further comprising a plurality of strings of LEDs electrically connected in series.

38. The light emitting device of claim 37, wherein electrical ends of the plurality of strings of LEDs are electrically connected to areas of electrically conductive traces.

39. A light emitting device, comprising:
a submount;
a light emission area disposed over the submount; and
a retention material at least partially disposed around the light emission area;
wherein the retention material comprises an outer edge portion comprising an integrally formed fillet at least partially disposed in the light emission area.

40. The light emitting device of claim 39, wherein the outer edge portion comprises a concave upper surface.

41. The light emitting device of claim 39, wherein the submount comprises a base material and at least one reflection enhancement layer, wherein the reflection enhancement layer is at least partially disposed between portions of the light emission area and portions of the base material.

42. The light emitting device of claim 41, wherein the outer edge portion is disposed over a portion of the reflection enhancement layer.

43. A light emitting device, comprising:
a submount;
a light emission area comprising at least one light emitting diode (LED) disposed over the submount; and
a fillet at least partially disposed about the light emission area;
wherein the fillet is directly adjacent to a portion of the submount; and
wherein a portion of the fillet and a portion of the at least one LED are coplanar along a portion of the submount.

44. The light emitting device of claim 43, further comprising a retention material disposed about the light emission area.

45. The light emitting device of claim 43, wherein the fillet is an integral portion of the retention material.

46. The light emitting device of claim 43, wherein the submount comprises a base material and at least one reflection enhancement layer disposed over the base material, at least partially between the base material and the light emission area.

47. The light emitting device of claim 46, wherein the fillet is adjacent to a portion of the reflection enhancement layer.

48. The light emitting device of claim 46, wherein the submount further comprises a dielectric laminate at least partially disposed over the base material in an area outside of the light emission area.

49. The light emitting device of claim 48, wherein the fillet is directly adjacent to a portion of the reflection enhancement layer and a portion of the dielectric laminate.

50. The light emitting device of claim 43, wherein the light emission area comprises a plurality of LEDs and a filling material.

51. The light emitting device of claim 50, wherein the filling material comprises an encapsulant having a selective amount of phosphor disposed therein.

52. The light emitting device of claim 51, wherein the fillet comprises a concave upper surface.

\* \* \* \* \*